US009087885B2

(12) United States Patent
Ji et al.

(10) Patent No.: US 9,087,885 B2
(45) Date of Patent: Jul. 21, 2015

(54) METHOD OF FABRICATING SEMICONDUCTOR DEVICES HAVING THROUGH-SILICON VIA (TSV) STRUCTURES

(71) Applicant: Samsung Electronics Co., Ltd., Suwon-si, Gyeonggi-do (KR)

(72) Inventors: Sang-Wook Ji, Seoul (KR); Yeong-Lyeol Park, Yongin-si (KR); Hyoung-Yol Mun, Yongin-si (KR); In-Kyum Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/247,234

(22) Filed: Apr. 7, 2014

(65) Prior Publication Data

US 2015/0064899 A1    Mar. 5, 2015

(30) Foreign Application Priority Data

Aug. 29, 2013    (KR) ......................... 10-2013-0103249

(51) Int. Cl.
| H01L 21/331 | (2006.01) |
| H01L 21/8222 | (2006.01) |
| H01L 21/768 | (2006.01) |
| H01L 23/00 | (2006.01) |

(52) U.S. Cl.
CPC .... *H01L 21/76898* (2013.01); *H01L 21/76802* (2013.01); *H01L 21/76877* (2013.01); *H01L 24/11* (2013.01); *H01L 2924/13091* (2013.01)

(58) Field of Classification Search
CPC ............... H01L 21/0228; H01L 21/02274; H01L 21/02378; H01L 21/02381; H01L 21/28194; H01L 21/76264; H01L 21/76805; H01L 21/28556; H01L 21/76802; H01L 2224/8634; H01L 2224/868; H01L 21/76204; H01L 2224/03616

USPC ......... 438/700, 680, 692, 626, 613, 672, 311, 438/682, 931, 679, 513, 723, 752, 753, 438/756; 257/396, E21.006, E21.023, 257/E21.054, E21.126, E21.127, E21.129, 257/E21.17, E21.231, E21.267, E21.278, 257/E21.304, E21.311, E21.545, E21.55, 257/E21.577, E21.585
See application file for complete search history.

(56) References Cited

U.S. PATENT DOCUMENTS

| 7,233,048 | B2 | 6/2007 | Rybnicek | |
| 8,492,260 | B2 * | 7/2013 | Parsey et al. | 438/598 |
| 8,884,440 | B2 * | 11/2014 | Kim et al. | 257/774 |
| 2012/0038385 | A1 | 2/2012 | Eaglesham et al. | |
| 2012/0049320 | A1 | 3/2012 | Parsey, Jr. et al. | |

FOREIGN PATENT DOCUMENTS

KR    101176351 B1    8/2012

* cited by examiner

*Primary Examiner* — David Nhu

(74) *Attorney, Agent, or Firm* — Renaissance IP Law Group LLP

(57) ABSTRACT

Provided is a method of fabricating a semiconductor device. In one embodiment, the method includes forming at least one unit device in a substrate and on a front side of the substrate, forming a through-silicon via (TSV) structure apart from the at least one unit device to substantially vertically penetrate the substrate, the TSV structure having a back end including a concave portion, forming an internal circuit on the front side of the substrate and a front end of the TSV structure to be electrically connected to the at least one unit device and the front end of the TSV structure, forming a front side bump on the front side of the substrate to be electrically connected to the front end of the TSV structure, forming a redistribution layer on a back side of the substrate to be electrically connected to the back end of the TSV structure, and forming a back side bump to be electrically connected to the redistribution layer.

16 Claims, 18 Drawing Sheets

METHOD OF FABRICATING SEMICONDUCTOR DEVICES HAVING THROUGH-SILICON VIA (TSV) STRUCTURES

CROSS-REFERENCE TO RELATED APPLICATION

This application claims priority under 35 U.S.C. §119 to Korean Patent Application No. 10-2013-0103249 filed on Aug. 29, 2013, the disclosure of which is hereby incorporated by reference in its entirety.

BACKGROUND

1. Technical Field

Embodiments of the inventive concept provide a semiconductor device having through-silicon via (TSV) structures that enable back-grinding process monitoring, a method of fabricating the semiconductor device, a semiconductor device stack structure, and various electronic systems.

2. Description of Related Art

Due to the demand for highly integrated, high-performance semiconductor devices, an integration technique capable of substantially vertically stacking semiconductor devices using through-silicon via (TSV) structures has been proposed.

SUMMARY

Embodiments of the inventive concept provide a semiconductor device having through-silicon via (TSV) structures.

Other embodiments of the inventive concept provide a stack structure of a semiconductor device having TSV structures.

Other embodiments of the inventive concept provide electronic systems including a semiconductor device having TSV structures.

Other embodiments of the inventive concept provide a method of fabricating a semiconductor device having TSV structures.

The technical objectives of the inventive disclosure are not limited to the above disclosure; other objectives may become apparent to those of ordinary skill in the art based on the following descriptions.

In accordance with an aspect of the inventive concept, a method of fabricating a semiconductor device includes forming at least one unit device on a front side of the substrate, forming a TSV structure to substantially vertically penetrate the substrate, the TSV structure having a back end including a concave portion, forming an internal circuit overlying a front end of the TSV structure to be electrically connected to the at least one unit device and the front end of the TSV structure, and forming a front side bump on the front side of the substrate to be electrically connected to the front end of the TSV structure. In some embodiments, the method may further include forming a redistribution layer on a back side of the substrate to be electrically connected to the back end of the TSV structure, and forming a back side bump to be electrically connected to the redistribution layer.

The formation of the TSV structure may include forming a front side lower interlayer insulating layer on the front side of the substrate to cover the at least one unit device, performing an etching process using a TSV hole mask pattern formed on the front side lower interlayer insulating layer as a patterning mask to form a TSV hole in the substrate, the TSV hole having a bottom surface in which the concave portion is formed, removing the TSV hole mask pattern, conformally forming a TSV liner layer, a TSV barrier layer, and a TSV seed layer on the front side lower interlayer insulating layer and an inner wall of the TSV hole, forming a TSV core material layer on the TSV seed layer to fill the TSV hole, and performing a planarization process on the resulting structure to expose a surface of the front side lower interlayer insulating layer to form a TSV liner pattern, a TSV barrier pattern, a TSV seed pattern, and a TSV core pattern within the TSV hole.

The exposure of the front side lower interlayer insulating layer may include performing a first chemical mechanical polishing (CMP) process to remove the TSV core material layer and the TSV seed layer from the front side lower interlayer insulating layer, performing a second CMP process to remove the TSV bather layer from the front side lower interlayer insulating layer, and performing a wet etching process to remove the TSV liner layer from the front side lower interlayer insulating layer.

The formation of the internal circuit may include forming a plurality of conductive inner vias and multilayered conductive inner wires on the front side lower interlayer insulating layer and the TSV structures, forming a TSV pad on the front side lower interlayer insulating layer in contact with the front end of the TSV structure, forming a front side upper interlayer insulating layer on the front side lower interlayer insulating layer to cover the plurality of conductive inner vias, the multilayered conductive inner wires, and the TSV pad, forming a front side bump via plug in the front lower and upper interlayer insulating layers to be electrically connected to the front end of the TSV structure, and forming a front side pad to cover a top surface of the front side bump via plug.

The formation of the front side bump may include forming a front side passivation layer on the front side upper interlayer insulating layer, the front side passivation layer including a lower opening exposing an upper portion of the front side pad, forming a front side bump barrier layer on the front side passivation layer and within the lower opening, forming a front side bump mask pattern on the front side bump barrier layer, the front side bump mask pattern having an upper opening substantially vertically aligned with the lower opening, forming a front side bump metal layer and a front side bump capping layer within the lower opening and the upper opening, removing the front side bump mask pattern to expose a portion of the front side bump barrier layer, and partially removing the exposed portion of the front side bump barrier layer on the front side passivation layer.

The formation of the redistribution layer may include entirely removing the back side of the substrate to expose back ends of the TSV structures, forming a back side interlayer insulating layer on the back side of the substrate to cover the back ends of the TSV structures, partially removing a back end of the TSV core pattern of each of the TSV structures using a planarization process, forming a redistribution mask pattern on the back side interlayer insulating layer, the redistribution mask pattern having a groove exposing the partially removed back end of the TSV core pattern, filling the groove with the redistribution layer, and removing the redistribution mask pattern.

The formation of the back side bump may include forming a back side passivation layer on the back side interlayer insulating layer, the back side passivation layer having a lower opening exposing a portion of the redistribution layer, forming a back side bump barrier layer on the back side passivation layer and within the lower opening, forming a back side bump mask pattern on the back side bump barrier layer, the back side bump mask pattern having an upper opening substantially vertically aligned with the lower opening, forming a back side bump metal layer and a back side bump capping layer within the lower and upper openings, removing the back side bump mask pattern to expose the back side bump barrier layer, and partially removing the back side bump barrier layer exposed on the back side passivation layer.

The partial removal of the back end of the TSV core pattern may include performing a plurality of CMP processes such that surfaces of back ends of TSV core patterns have ring shapes, and the ring shapes have a constant width.

The performing of the plurality of CMP processes may include monitoring ring widths of the ring shapes, and performing a subsequent CMP process by controlling a horizontal angle of a CMP process when the ring widths are not constant.

The controlling of the horizontal angle of the CMP process may include elevating a horizontal angle of a CMP process in a place corresponding to a larger one of the monitored ring widths or lowering a horizontal angle of a CMP process in a place corresponding to a smaller one of the monitored ring widths.

The partial removal of the back end of the TSV core pattern may include performing a plurality of CMP processes such that a surface of the back end of the TSV core pattern has a simple closed curve.

In accordance with another aspect of the inventive concept, a method of fabricating a semiconductor device includes forming a front side lower interlayer insulating layer to cover at least one unit device formed in a substrate and on a front side of the substrate, forming a TSV hole in the substrate using an etching process such that a plurality of concave portions are formed in a bottom surface of the substrate, the TSV hole spaced apart from the at least one unit device to substantially vertically penetrate the substrate, conformally forming a TSV liner layer, a TSV barrier layer, and a TSV seed layer on the front side lower interlayer insulating layer and an inner wall of the TSV hole, forming a TSV core material layer on the TSV seed layer to fill the TSV hole, exposing a surface of the front side lower interlayer insulating layer using a planarization process, forming a TSV structure including a TSV liner pattern, a TSV barrier pattern, a TSV seed pattern, and a TSV core pattern within the TSV hole formed using the planarization process, forming an internal circuit on the front side of the substrate and a front end of the TSV structure to be electrically connected to the at least one unit device and the front end of the TSV structure, forming a front side bump on the front side of the substrate to be electrically connected to the front end of the TSV structure, forming a redistribution layer on a back side of the substrate to be electrically connected to back ends of the TSV structures, and forming a back side bump to be electrically connected to the redistribution layer.

The formation of the redistribution layer may include entirely removing the back side of the substrate to expose the back ends of the TSV structures, forming a back side interlayer insulating layer on the back side of the substrate to cover the back ends of the TSV structures, partially removing a back end of a TSV core pattern of the TSV structure using a planarization process, forming a redistribution mask pattern on the back side interlayer insulating layer, the redistribution mask pattern having a groove exposing the partially removed back end of the TSV core pattern, filling the groove with the redistribution layer, and removing the redistribution mask pattern.

The partial removal of the back end of the TSV core pattern may include performing a plurality of CMP processes such that a surface of the back end of the TSV core pattern has a multi-ring shape, and respective ring shapes have constant ring widths.

The performing the plurality of CMP processes may include monitoring the ring widths of the respective ring shapes, and performing a subsequent CMP process by controlling a horizontal angle of a CMP process when the ring widths are not constant.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
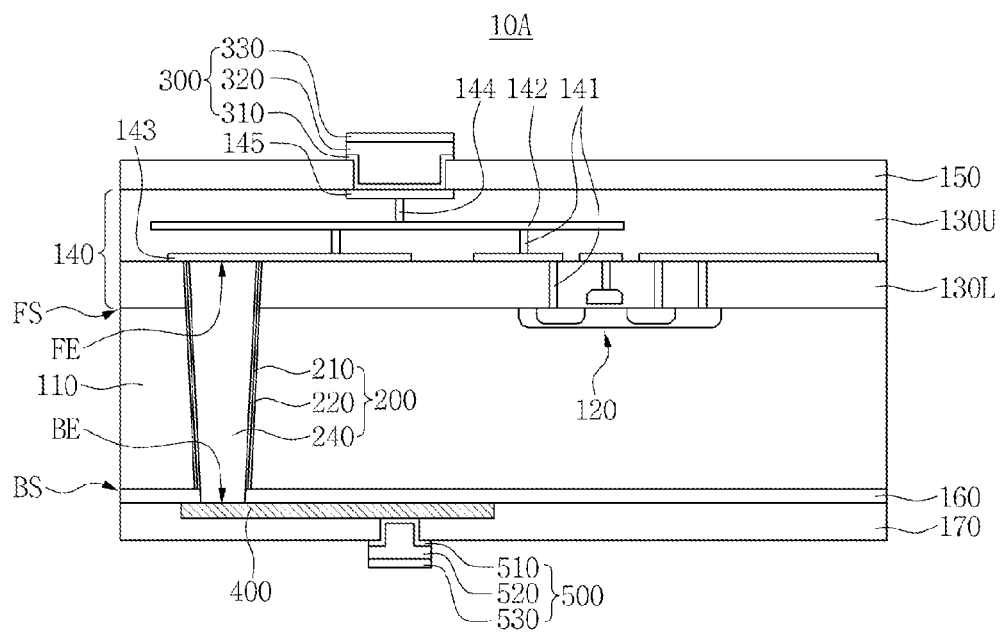
FIG. 1A is a schematic cross-sectional view of a semiconductor device according to embodiments of the inventive concept.

Various embodiments will now be described more fully with reference to the accompanying drawings in which some embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to those skilled in the art.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

Spatially relative terms, such as "below," "beneath," "lower," "above," and "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein may be interpreted accordingly.

Embodiments of the inventive concept are described herein with reference to cross-section and/or plan illustrations that are schematic illustrations of idealized embodiments of the inventive concept. In the drawings, the thicknesses of layers and regions are exaggerated for clarity. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

In the present specification, relative terms, such as "front side" and "back side" and "upper side or top side" and "lower side or bottom side", may be used herein for ease of description to describe the inventive concept. Accordingly, a front side or back side does not necessarily indicate a specific direction or location but can be used interchangeably. For example, a front side or top side could be termed a first side, and a back side or bottom side could be termed a second side. Conversely, a back side or bottom side could be termed a first side, and a front side or top side could be termed a second side. However, to avoid confusion, the terms "front side" and "back side" are not used in the same sense in one embodiment.

In the present specification, a term "near" indicates that any one of at least two components having symmetric concepts is disposed nearer to another specific component than the others thereof. For instance, when a first end is near to a first side, it may be inferred that the first end is nearer to the first side than a second end or that the first end is nearer to the first side than a second side.

FIG. 1A is a schematic cross-sectional view of a semiconductor device 10A according to some embodiments of the inventive concept.

Referring to FIG. 1A, the semiconductor device 10A may include unit device(s) 120 formed in a substrate 110, a through-silicon via (TSV) structure 200 formed in the substrate 110, internal circuits 140 and a front side bump 300 formed on a front surface FS of the substrate 110, and a redistribution layer 400 and a back side bump 500 formed on a back surface BS of the substrate 110. Also, the semiconductor device 10A may further include a front side lower interlayer insulating layer 130L and a front side upper interlayer insulating layer 130U formed between the front surface FS of the substrate 110 and the front side bump 300, and a back side interlayer insulating layer 160 and a back side passivation layer 170 formed between the back surface BS of the substrate 110 and the back side bump 500.

The substrate 110 may include a silicon wafer. For example, the substrate 110 may include a single crystalline silicon wafer, a silicon bulk wafer including a silicon carbide (SiC) layer or silicon germanium (SiGe) layer, or a silicon-on-insulator (SOI) wafer including an insulating layer. In the present embodiments, it is assumed that the substrate 110 is a single crystalline silicon bulk wafer.

The unit device(s) 120 may be formed in the substrate 110 and/or on the substrate 110. The unit device(s) 120 may include metal-oxide-semiconductor (MOS) transistors. Although only one unit device 120 is illustrated in FIG. 1A, a plurality of unit devices 120 may be formed.

The TSV structure 200 may penetrate the substrate 110. For example, the TSV structure 200 may include a font end FE facing the front surface FS of the substrate 110 and a back end BE facing the back surface BS of the substrate 110. The front end FE of the TSV structure 200 may be disposed close to or near the front surface FS of the substrate 110, and the back end BE of the TSV structure 200 may be disposed close to or near the back surface BS of the substrate 110. For instance, the front end FE of the TSV structure 200 may protrude from a surface of the front surface FS of the substrate 110, while the back end BE of the TSV structure 200 may protrude from a surface of the back surface BS of the substrate 110. The TSV structure 200 may include a TSV liner pattern 210, a TSV bather pattern 220, and a TSV core pattern 240. The TSV core pattern 240 may have a conical shape, and a side surface of the TSV core pattern 240 may be surrounded by the TSV barrier pattern 220 and the TSV liner pattern 210. The surface of the back end BE of the TSV core pattern 240 may form a simple closed curve having various shapes including, for example, a circular shape, an elliptical shape, and a polygonal shape. In other words, the surface of the back end BE of the TSV core pattern 240 may have a geometric shape formed by a closed curved line. The TSV core pattern 240 may include a metal, such as copper (Cu). The TSV bather pattern 220 may include titanium (Ti), titanium nitride (TiN), titanium tungsten (TiW), tantalum (Ta), tantalum nitride (TaN), or tungsten nitride (WN). The TSV barrier pattern 220 may include a single layer or a multilayered structure. The TSV liner pattern 210 may include an insulating material, such as silicon oxide. Each of TSV structures 200 may further include a TSV seed pattern interposed between the TSV barrier pattern 220 and the TSV core pattern 240. The TSV seed pattern may include copper (Cu), ruthenium (Ru), nickel (Ni), or tungsten (W). When the TSV core pattern 240 and the TSV seed pattern are formed of the same material, a boundary between the TSV core pattern 240 and the TSV seed pattern may disappear. In other words, the TSV core pattern 240 and the TSV seed pattern form a single layer.

The front side lower interlayer insulating layer 130L may be formed on the front surface FS of the substrate 110 to cover the unit device(s) 120. In this case, the front side lower interlayer insulating layer 130L may be formed using a single layer or a multilayered structure. A single layer is illustrated as the front side lower interlayer insulating layer 130L for the sake of brevity as shown in FIG. 1A. The front side lower interlayer insulating layer 130L may include an oxide such as silicon oxide.

The front side upper interlayer insulating layer 130U may be formed on the front side lower interlayer insulating layer 130L. The front side upper interlayer insulating layer 130U may be formed using a single layer or a multilayered structure. The front side upper interlayer insulating layer 130U is illustrated as a single layer as shown in FIG. 1A for the sake of brevity. The front side upper interlayer insulating layer 130U may include an oxide such as silicon oxide.

The internal circuits 140 may be formed on the front surface FS of the substrate 110 to be electrically connected to the unit devices(s) 120 and/or the TSV structure 200. The internal circuits 140 may include a plurality of conductive inner vias 141 and multilayered conductive inner wires 142. The conductive inner vias 141 may be substantially vertically connected to the unit device(s) 120 or the conductive inner wires 142 and transmit/receive electric signals. The conductive inner wires 142 may transmit/receive electric signals in a horizontal direction. The internal circuits 140 may include a conductor, such as doped silicon (doped-Si), a metal, a metal silicide, a metal alloy, or a metal compound.

In addition, the internal circuits 140 may further include a TSV pad 143, a front side bump via plug 144, and a front side pad 145. The TSV pad 143 may be in contact with the front end FE of the TSV structure 200. That is, the TSV pad 143 may be in contact (e.g., direct contact) with the exposed portion of the TSV core pattern 240 at the front end FE of the TSV structure 200. The TSV pad 143 may be electrically connected to some of the conductive inner vias 141. The TSV pad 143 may be formed using a single conductive layer or a multilayered conductive layer (e.g., a barrier metal layer and a pad metal layer). The front side bump via plug 144 may electrically connect a portion of an uppermost inner wire 142 and the front side pad 145. The front side bump via plug 144 may include a metal, such as copper (Cu), aluminum (Al), or tungsten (W). The front side pad 145 may be formed to cover a top surface of the front side bump via plug 144. The front side pad 145 may be in contact (e.g., direct contact) with the front side bump 300 to be described later. The internal circuits 140 may be covered or surrounded by the front side lower interlayer insulating layer 130L and the front side upper interlayer insulating layer 130U.

A front side passivation layer 150 may be formed on the front side upper interlayer insulating layer 130U. The front side passivation layer 150 may include silicon nitride, silicon oxide, or polyimide (PI).

The front side bump 300 may be formed within an opening in the front side passivation layer 150, and in contact (e.g., direct contact) with the front side pad 145. A portion of the front side bump 300 may be formed on the front side passivation layer 150 near edges of the opening. The front side bump 300 may include a front side bump bather layer 310, a front side bump conductive layer 320, and/or a front side bump capping layer 330. The front side bump barrier layer 310 may include a barrier metal. For example, the front side bump barrier layer 310 may include titanium (Ti), titanium nitride (TiN), titanium tungsten (TiW), tantalum (Ta), tantalum nitride (TaN), or tungsten nitride (WN). The front side bump barrier layer 310 may be formed of a single layer or a multilayered structure. The front side bump conductive layer 320 may include a metal, such as copper or nickel. The front side bump capping layer 330 may be formed on a top surface of the front side bump conductive layer 320. The front side bump capping layer 330 may cover only the top surface of the front side bump conductive layer 320. The front side bump capping layer 330 may include gold (Au), silver (Ag), or nickel (Ni).

The back side interlayer insulating layer 160 may be formed on the back surface BS of the substrate 110. The back side interlayer insulating layer 160 may substantially surround a side surface of the TSV structure 200. The back side interlayer insulating layer 160 may be in contact (e.g., direct contact) with the side surface of the TSV structure 200, for example, the TSV liner pattern 210. A top surface of the back side interlayer insulating layer 160 may be planarized. A surface of the back side interlayer insulating layer 160 may be substantially coplanar with a surface of the back end BE of the TSV structure 200. The back side interlayer insulating layer 160 may include silicon oxide.

The redistribution layer 400 may be formed on the back side interlayer insulating layer 160 to cover the back end BE of the TSV structure 200. The redistribution layer 400 may be in contact (e.g., direct contact) with the back end BE of the TSV structure 200. The redistribution layer 400 may include copper. The redistribution layer 400 may include nickel or gold formed on a surface thereof.

The back side passivation layer 170 may be formed on the back side interlayer insulating layer 160. The back side passivation layer 170 has an opening 577 that exposes a portion of the redistribution layer 400. The back side passivation layer 170 may be formed of an insulating material such as silicon nitride.

The back side bump 500 may be formed within an opening extending through the back side passivation layer 170, and in contact (e.g., direct contact) with the back end BE of the TSV structure 200. Accordingly, the back side bump 500 may be electrically connected to the TSV structure 200. The back side bump 500 may include a back side bump bather layer 510, a back side bump conductive layer 520, and/or a back side bump capping layer 530. The back side bump barrier layer 510 may include a barrier metal. For instance, the back side bump barrier layer 510 may include titanium (Ti), titanium nitride (TiN), titanium tungsten (TiW), tantalum (Ta), tantalum nitride (TaN), or tungsten nitride (WN). The back side bump barrier layer 510 may be formed using a single layer or a multilayered structure. The back side bump conductive layer 520 may include a metal, such as copper or nickel. The back side bump capping layer 530 may be formed on a surface of the back side bump conductive layer 520. The back side bump capping layer 530 may include gold (Au), silver (Ag), or nickel (Ni).

In some other embodiments, the back side bump 500 may be directly coupled to the back end BE of the TSV structure 200 without a redistribution layer connected therebetween.

Figure 1B:
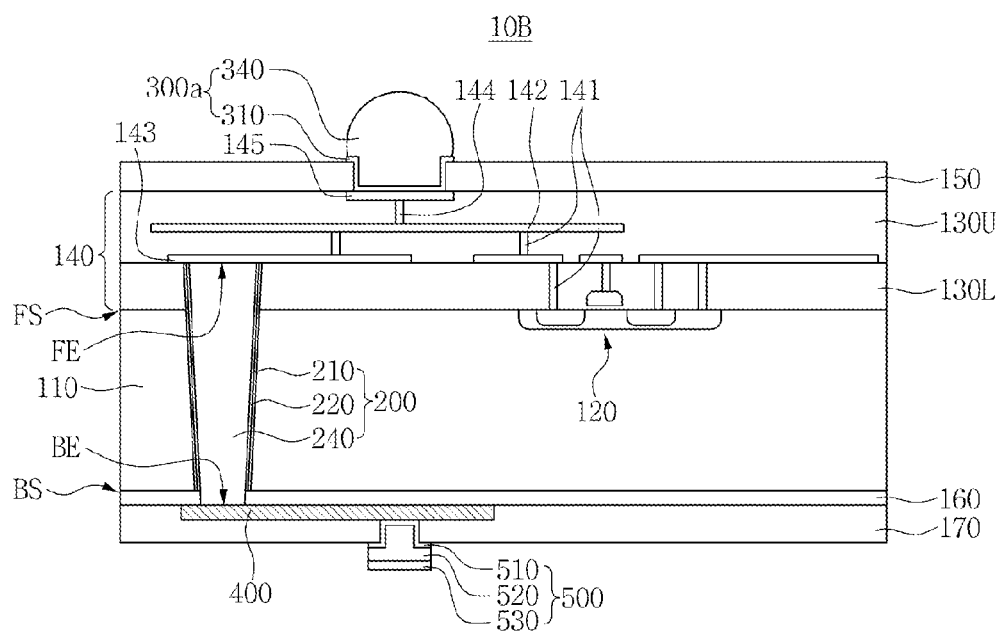
FIG. 1B is a schematic cross-sectional view of a semiconductor device according to other embodiments of the inventive concept.

FIG. 1B is a schematic cross-sectional view of a semiconductor device 10B according to some other embodiments of the inventive concept. Here, because the semiconductor device 10B shown in FIG. 1B is the same as the semiconductor device 10A shown in FIG. 1A except a shape of a front side bump 300a, a detailed description of the same components as in FIG. 1A will be omitted.

Referring to FIG. 1B, the semiconductor device 10B according to some embodiments of the inventive concept may include a front side bump barrier layer 310 being in contact (e.g., direct contact) with the front side pad 145 and the front side bump 300a including a solder material 340 formed on the front side bump barrier layer 310. That is, in the front side bump 300a of the semiconductor device 10B, the front side bump conductive layer 320 and the front side bump capping layer 330 described with reference to FIG. 1A may be replaced with the solder material 340. For instance, the solder material 340 may include tin (Sn), silver (Ag), and copper (Cu).

Figure 1C:
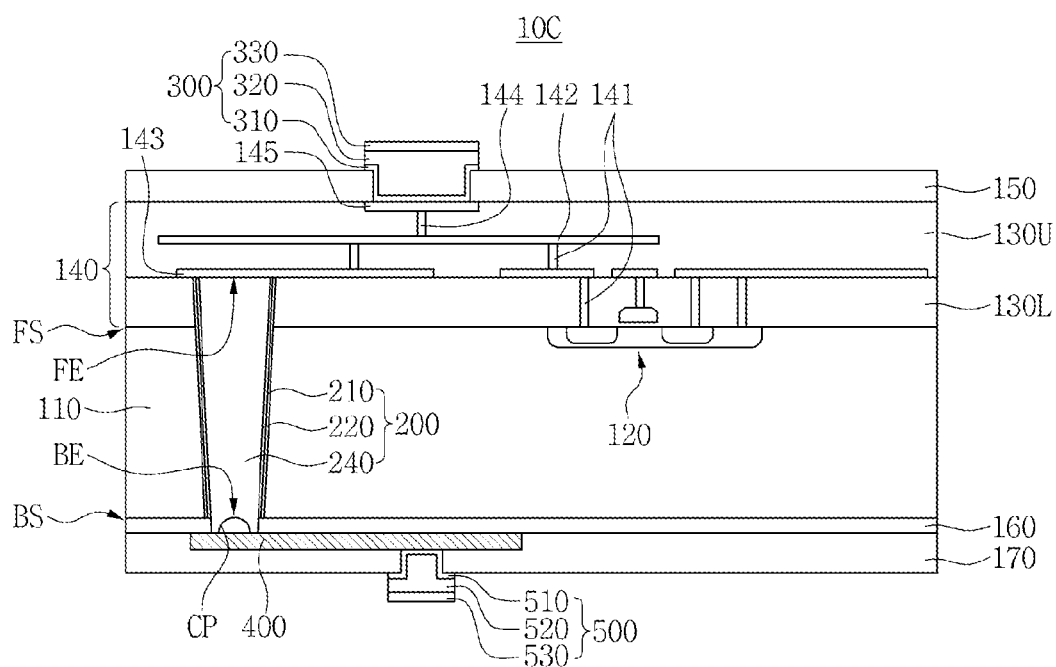
FIG. 1C is a schematic cross-sectional view of a semiconductor device according to other embodiments of the inventive concept.

FIG. 1C is a schematic cross-sectional view of a semiconductor device 10C according to some other embodiments of the inventive concept. Here, since the semiconductor device 10C shown in FIG. 1C is the same as the semiconductor device 10A shown in FIG. 1A except a shape of a back end BE of a TSV structure 200, a detailed description of the same components as in FIG. 1A will be omitted.

Referring to FIG. 1C, the semiconductor device 10C according to some embodiments of the inventive concept may include a TSV structure 200 having a concave portion CP formed in a back end BE. The inside of the concave portion CP may be filled with the back side interlayer insulating layer 160. Thus, a surface of the back end BE of the TSV core pattern 240 may have a ring shape.

Although FIG. 1C illustrates an example in which the back end BE of the TSV core pattern 240 includes one concave portion CP, the back end BE of the TSV core pattern 240 may have a plurality of concave portions CP. When the back end BE of the TSV structure 200 includes a plurality of concave portions CP, a surface of the back end BE of the TSV core pattern 240 may have a plurality of concentric ring shapes. In this case, the back side interlayer insulating layer 160 may be disposed in centers of the ring shapes and/or between the ring shapes.

Figure 2A:
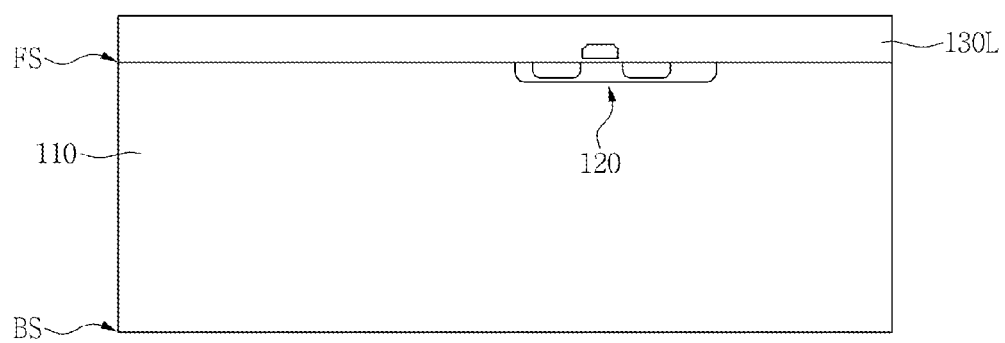
FIGS. 2A through 2Z are schematic cross-sectional views illustrating a method of fabricating a semiconductor device according to embodiments of the inventive concept.
Figure 2B:
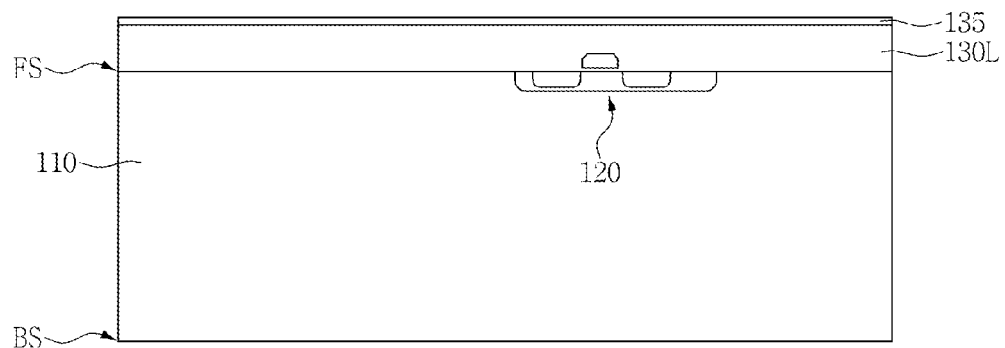
Figure 2C:
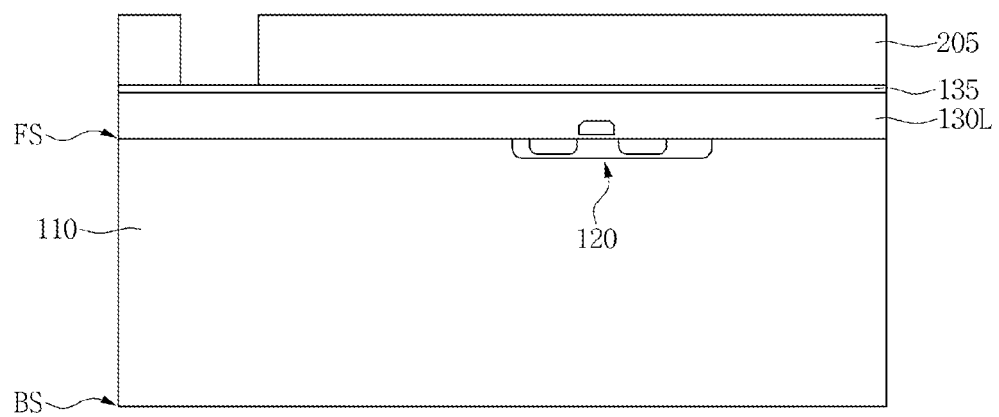
Figure 2D:
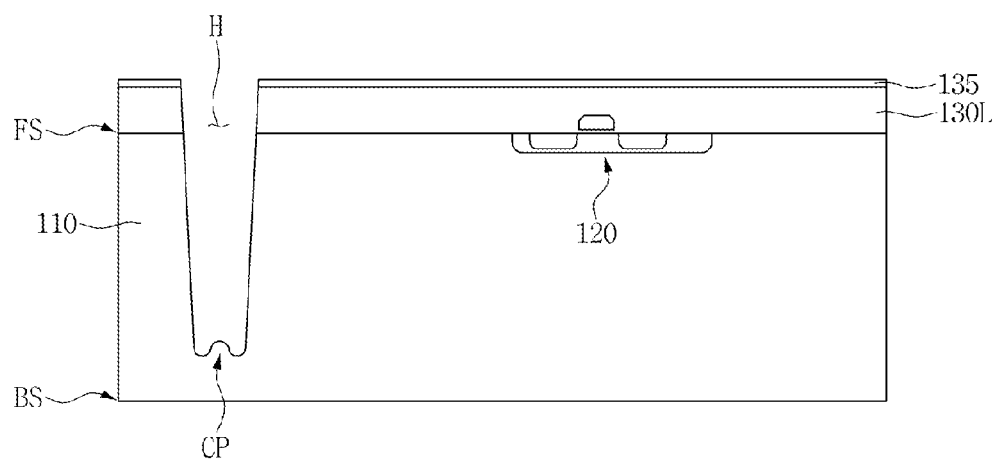
Figure 2E:
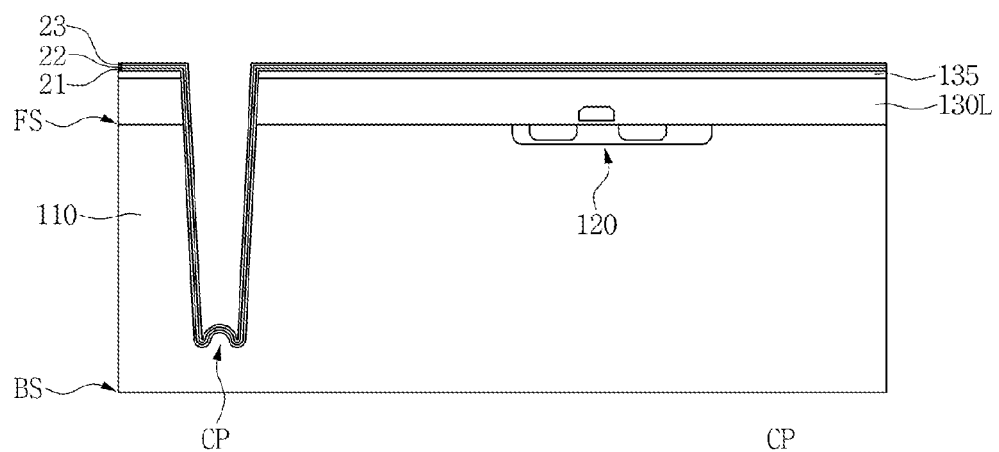
Figure 2F:
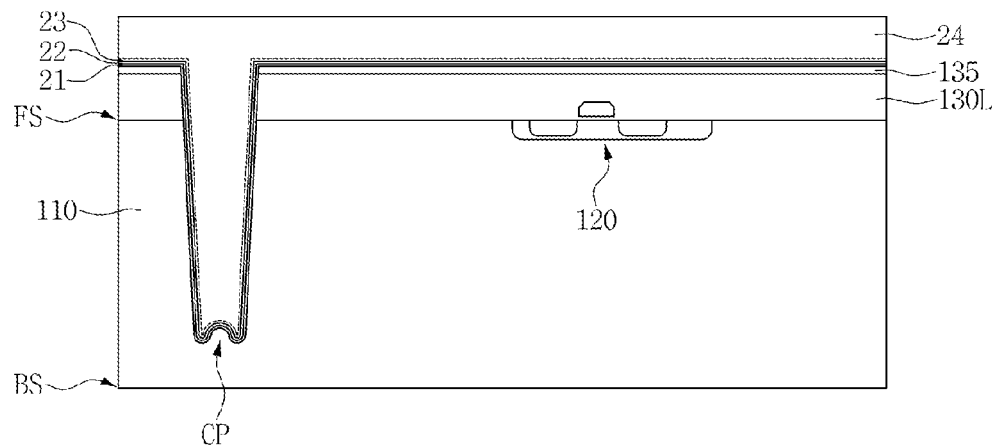
Figure 2G:
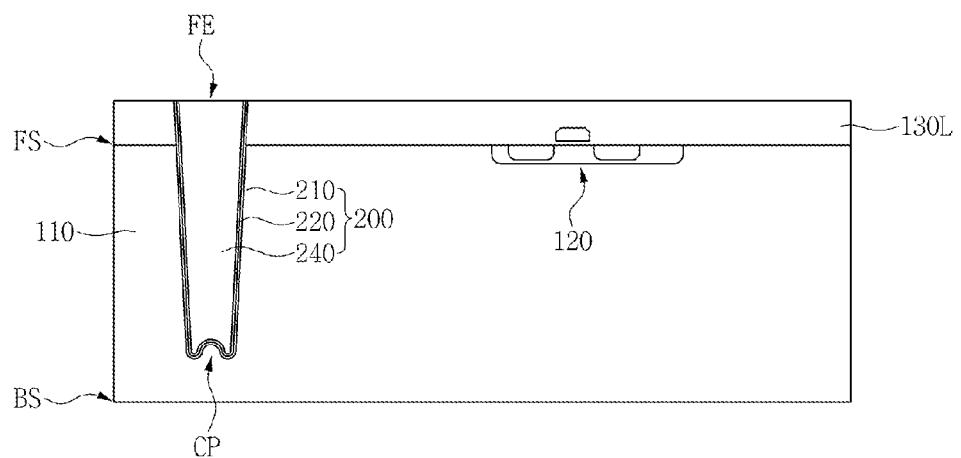
Figure 2H:
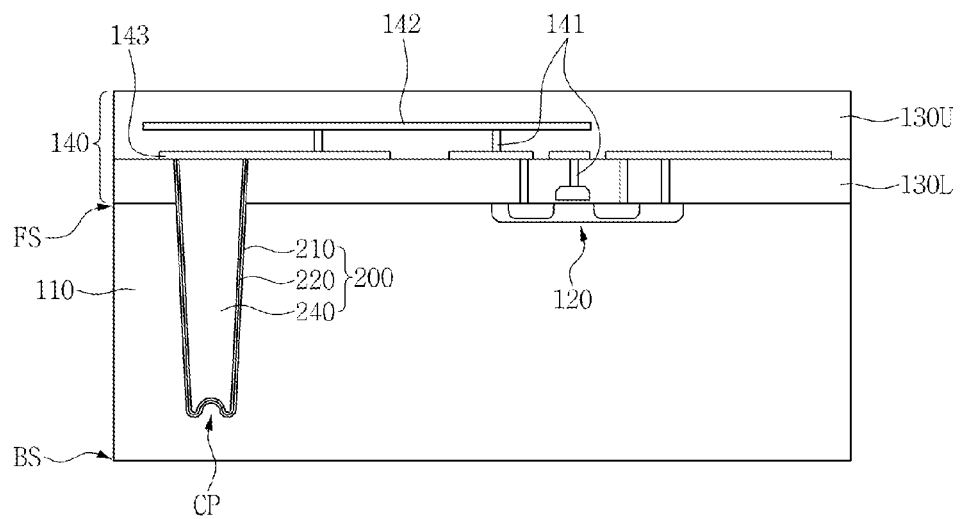
Figure 2I:
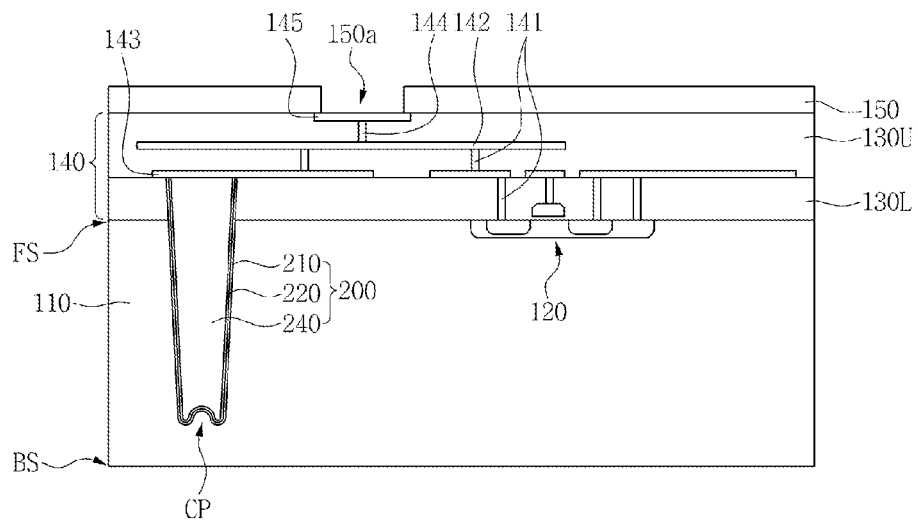
Figure 2J:
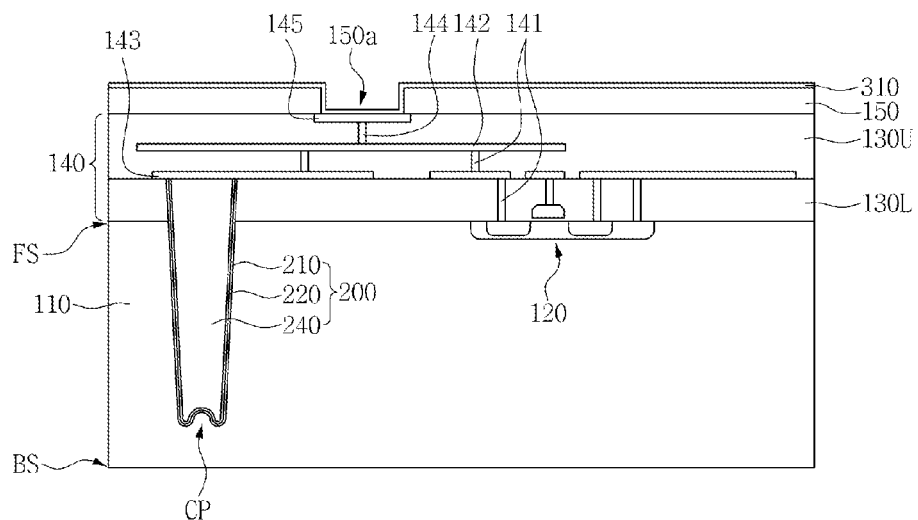
Figure 2K:
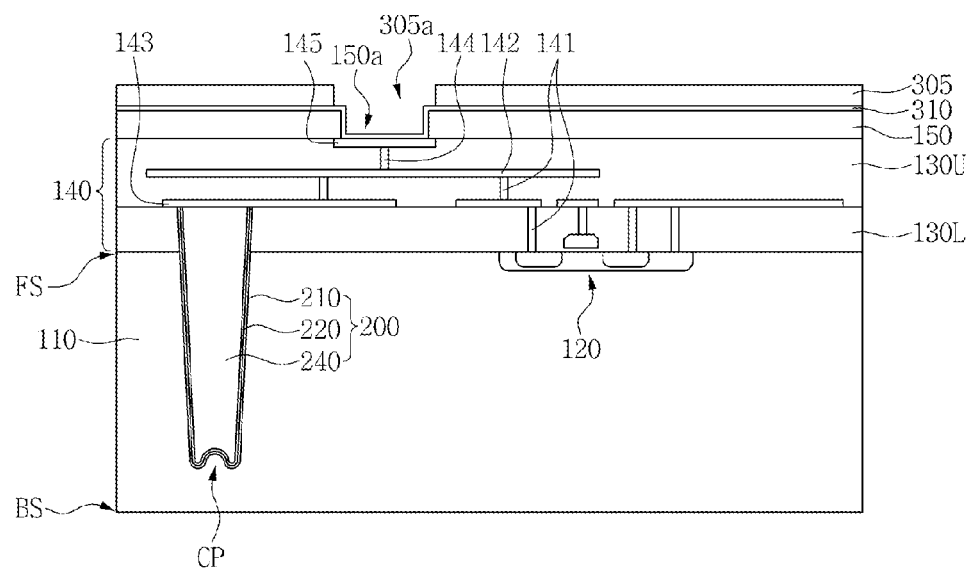
Figure 2L:
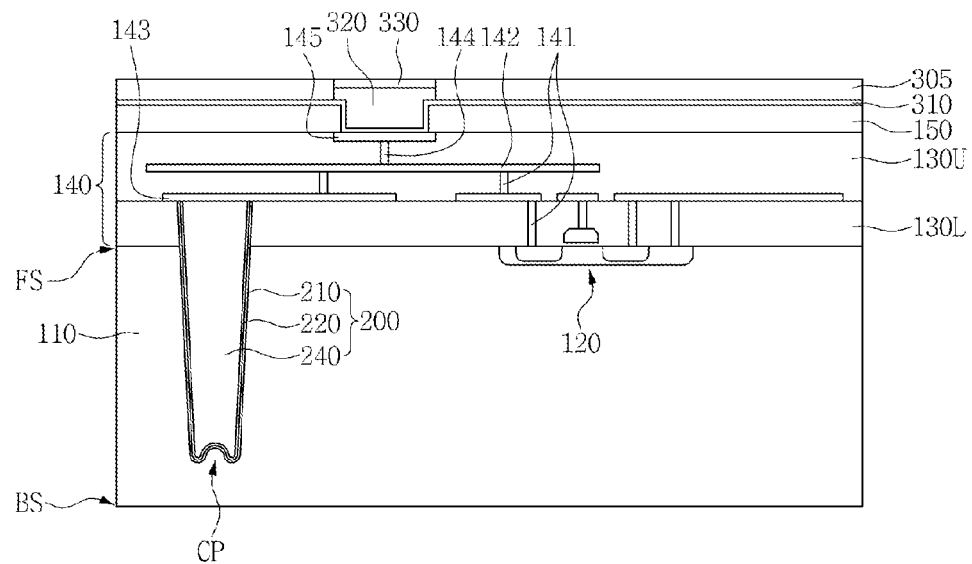
Figure 2M:
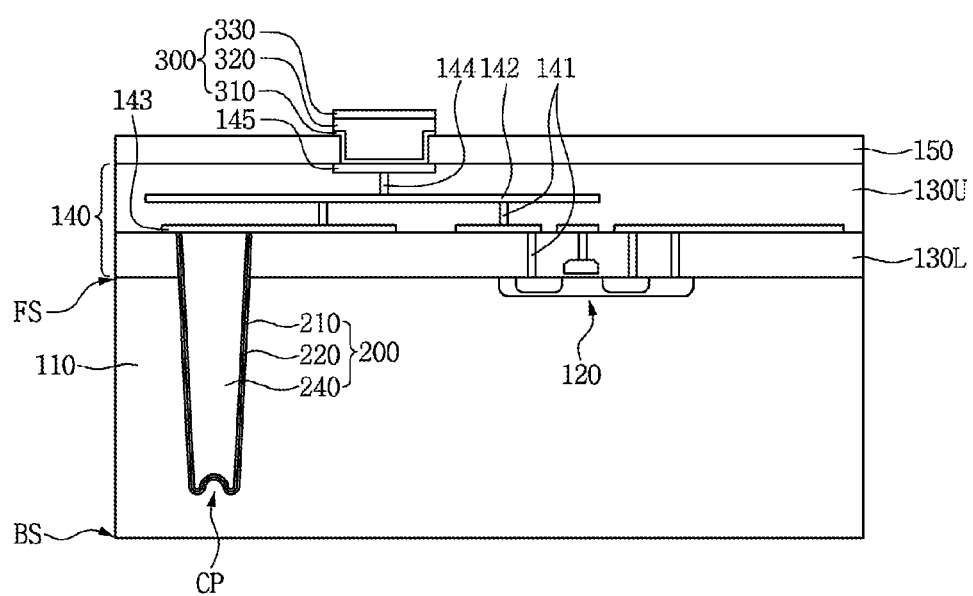
Figure 2N:
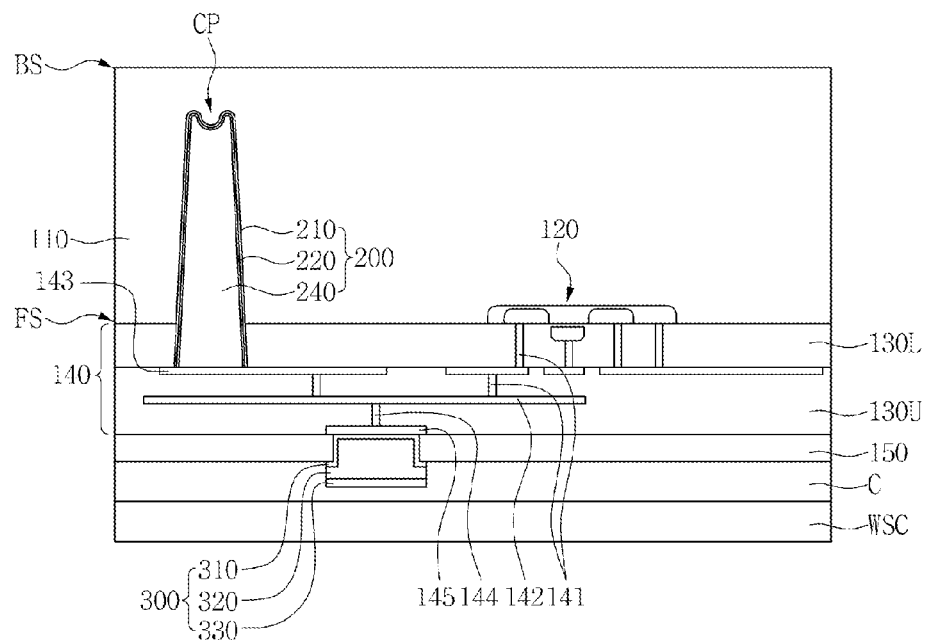
Figure 2O:
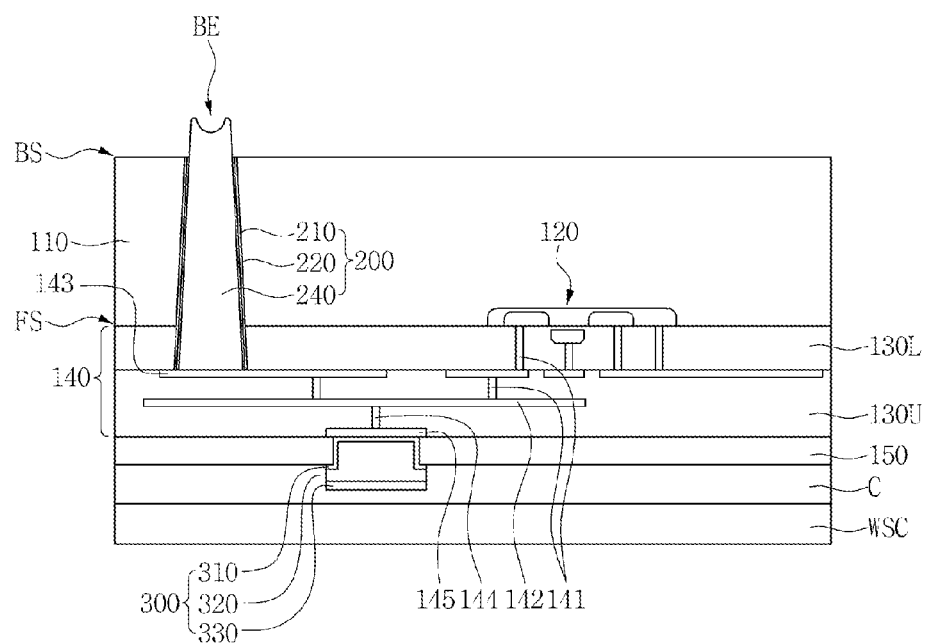
Figure 2P:
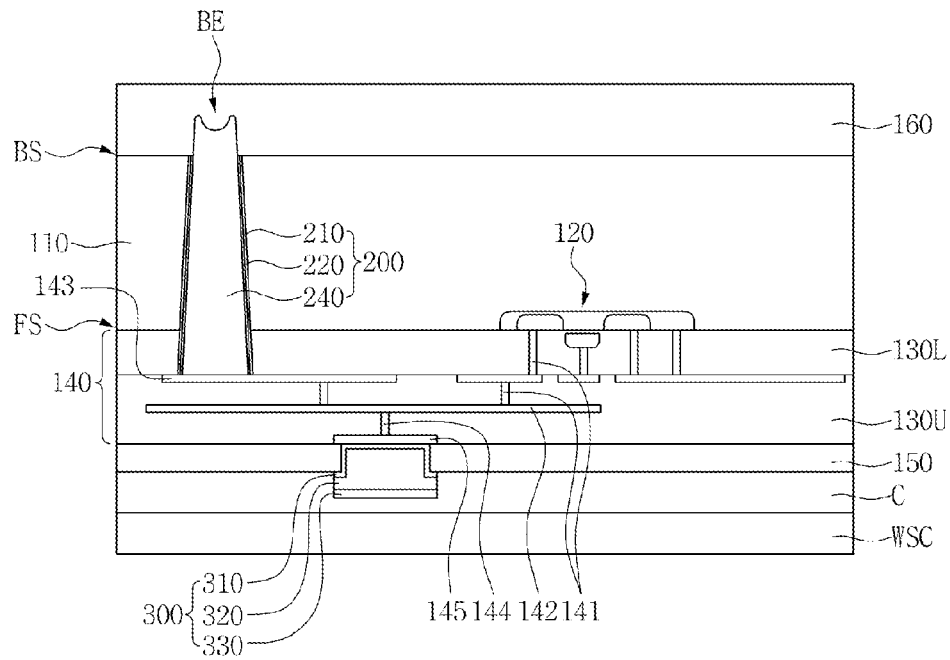
Figure 2Q:
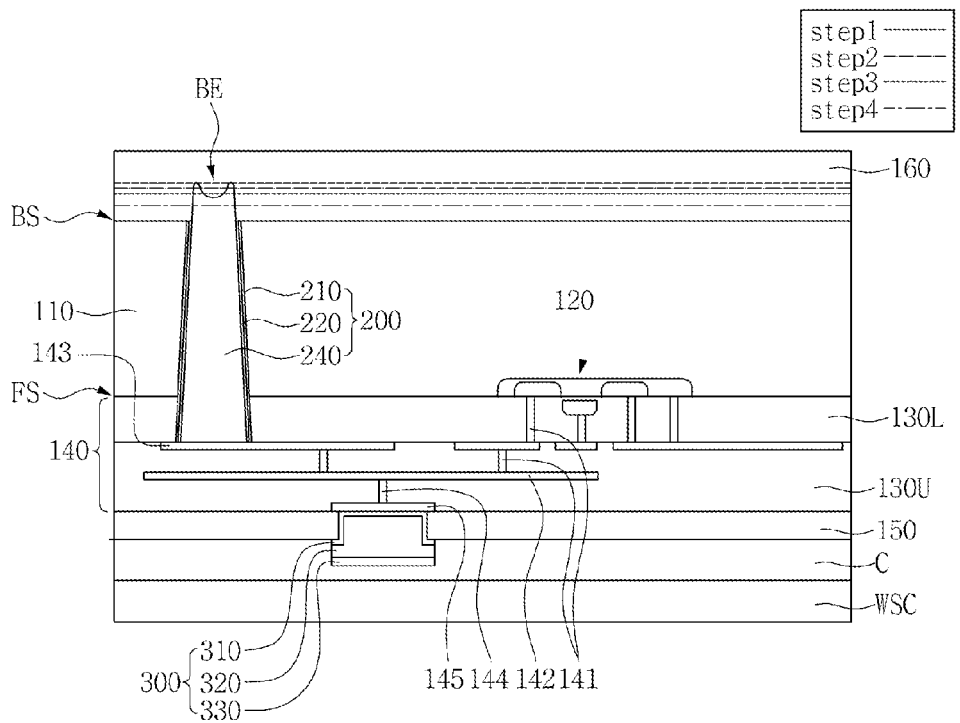
Figure 2R:
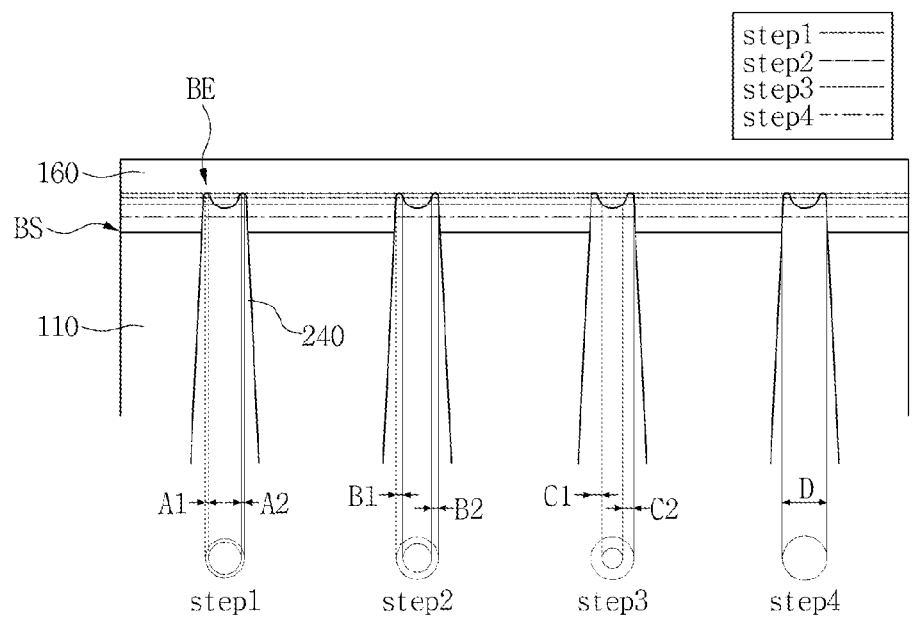
Figure 2S:
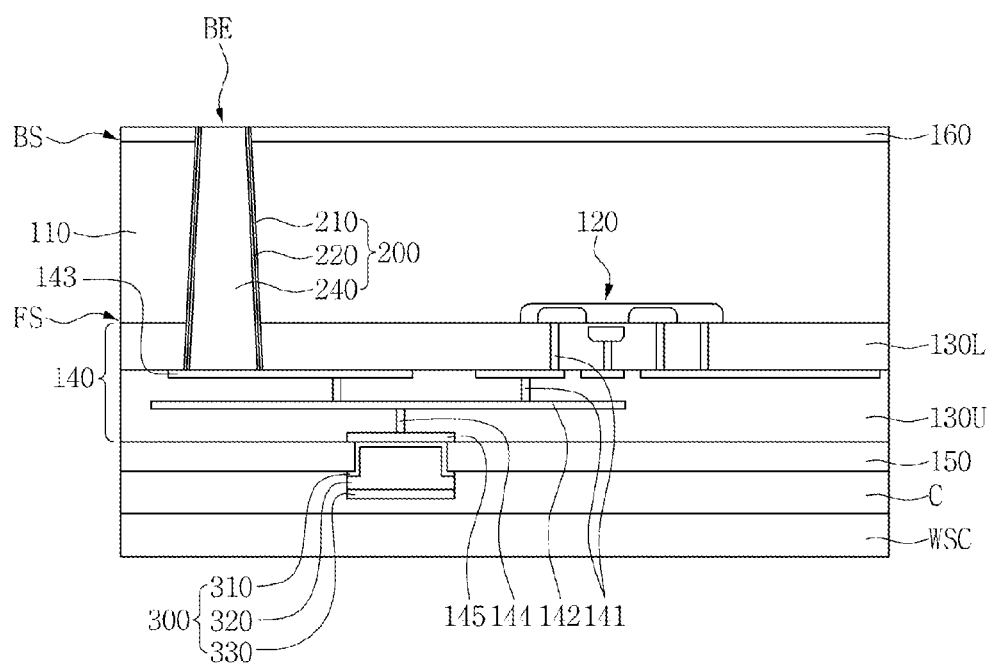
Figure 2T:
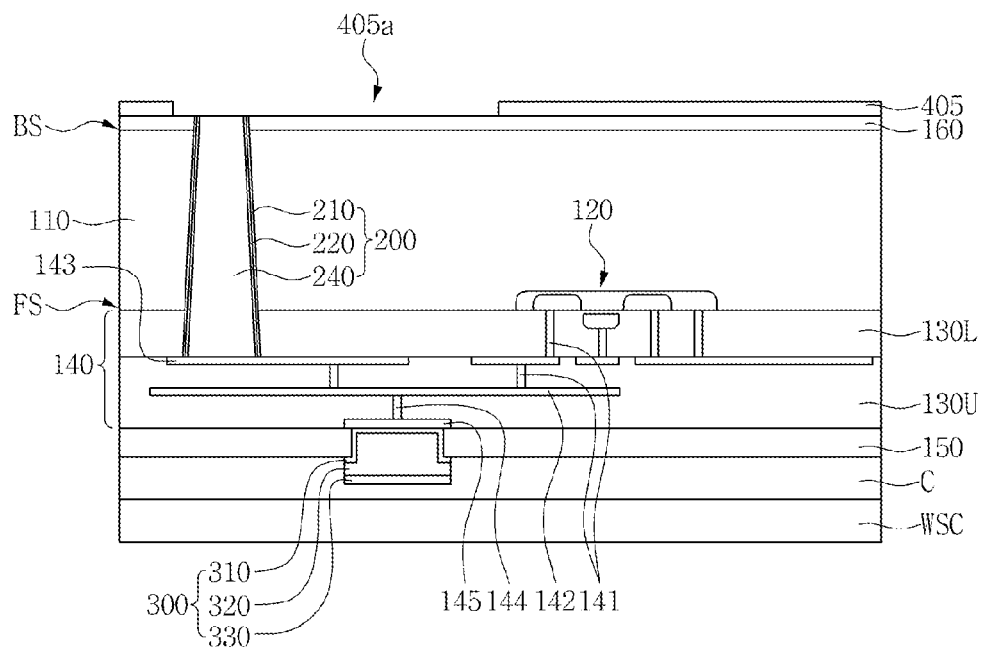
Figure 2U:
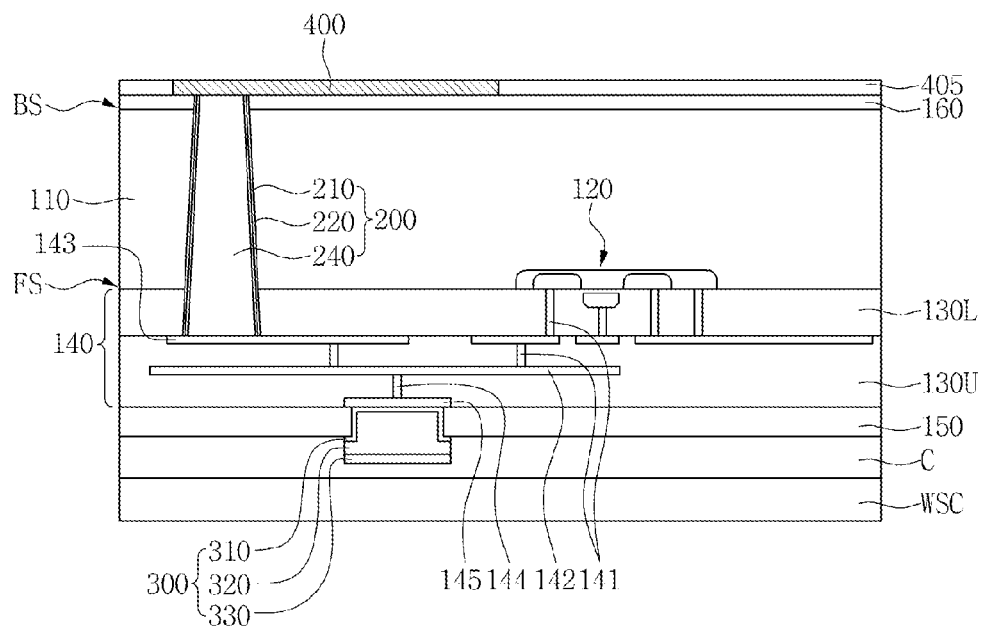
Figure 2V:
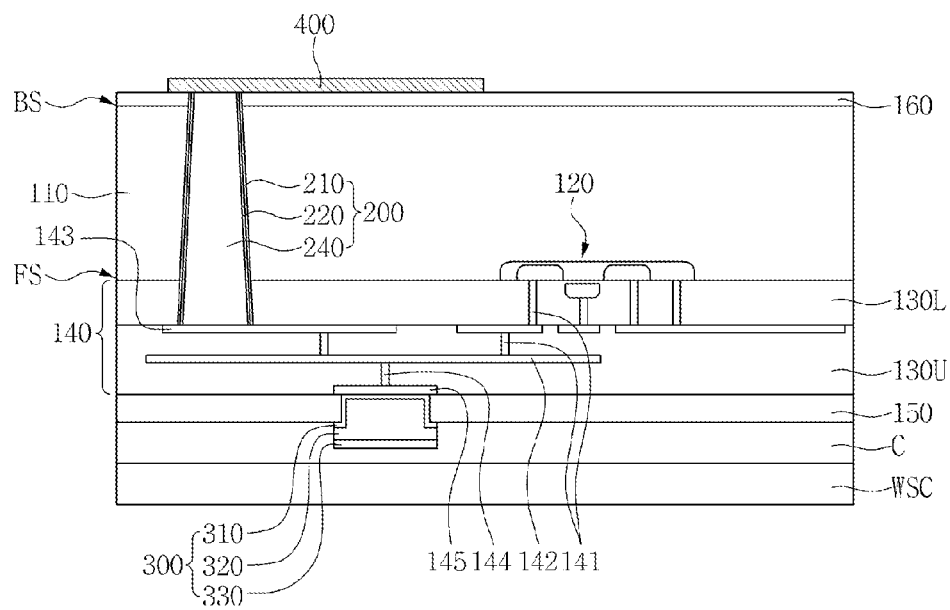
Figure 2W:
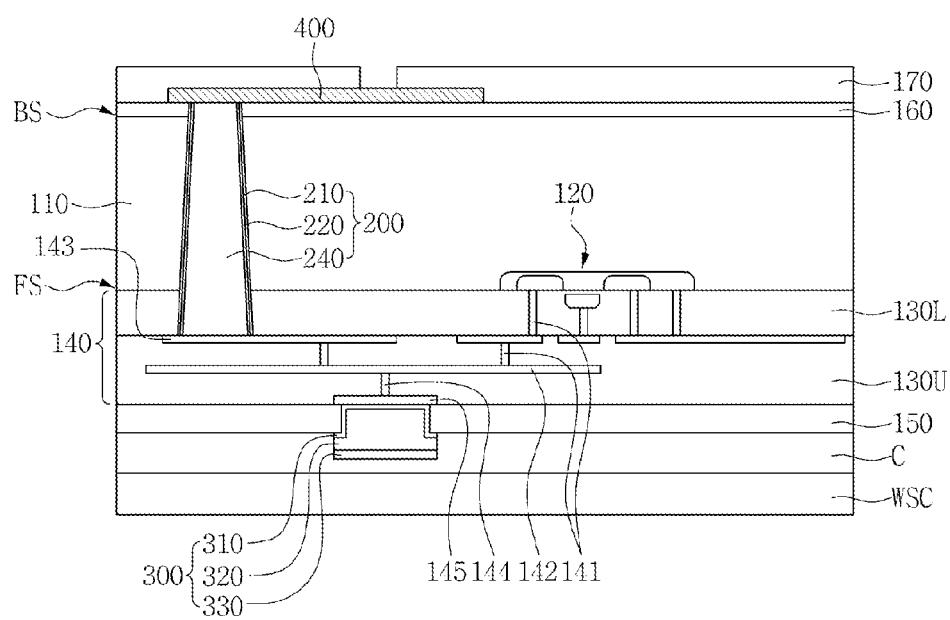
Figure 2X:
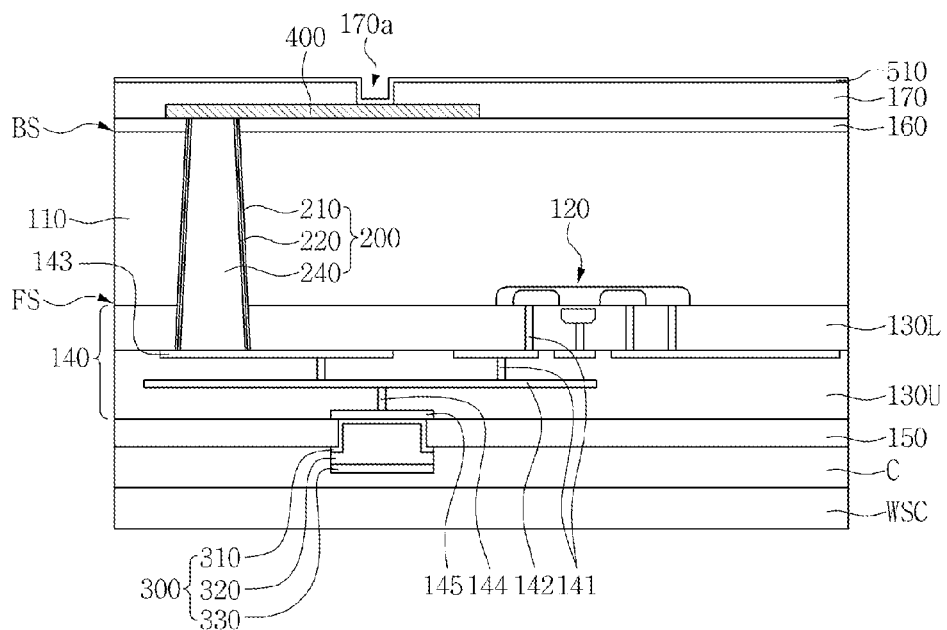
Figure 2Y:
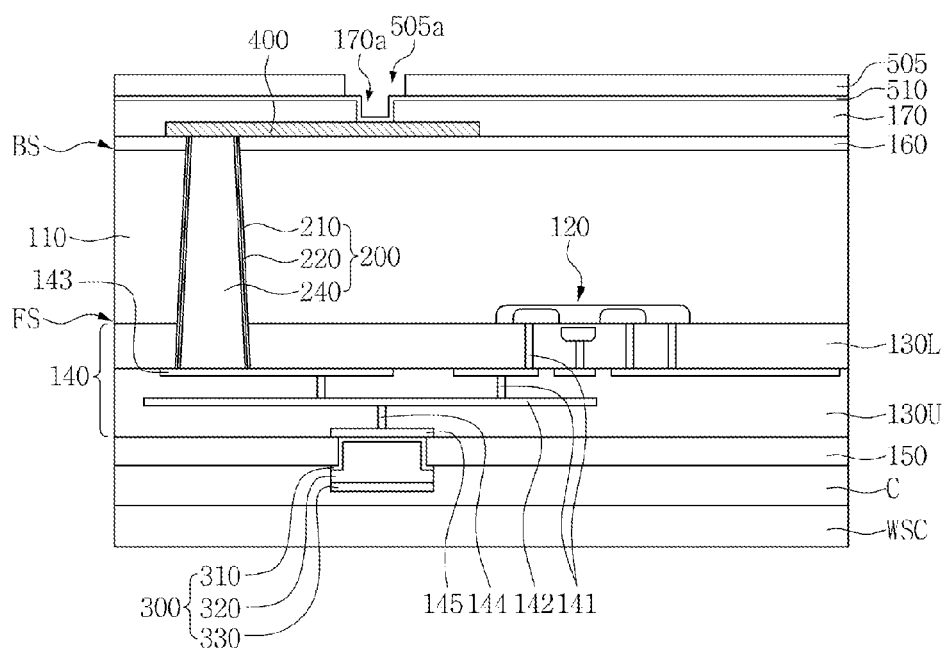
Figure 2Z:
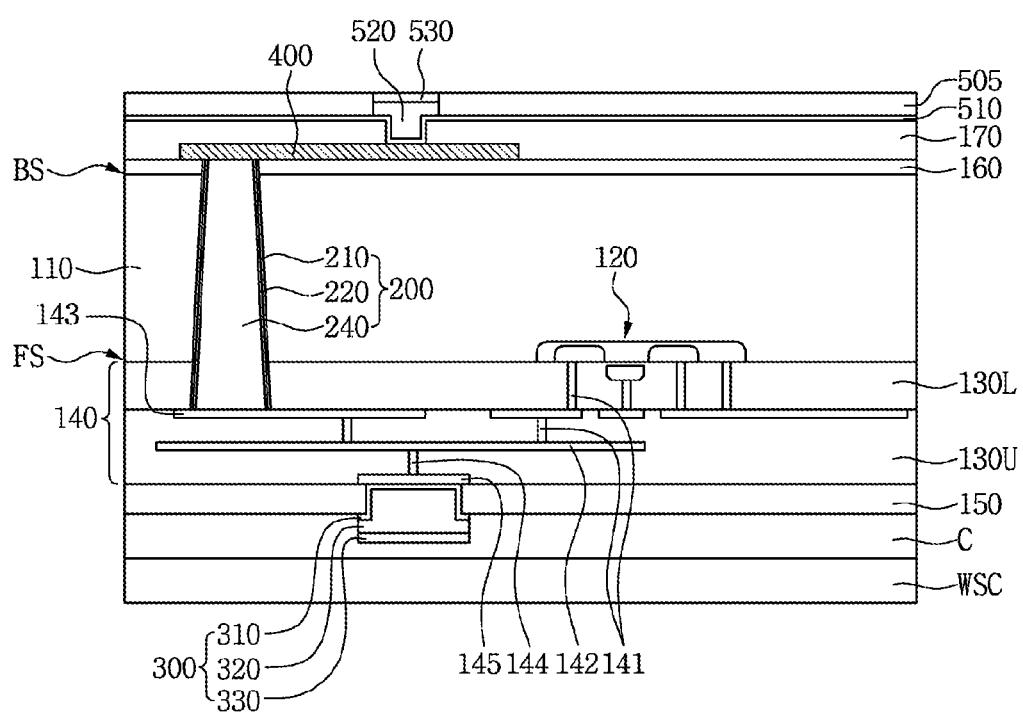

FIGS. 2A through 2Z are schematic cross-sectional views illustrating a method of fabricating a semiconductor device according to some embodiments of the inventive concept.

Referring to FIG. 2A, the method may include forming unit device(s) 120 on a front surface FS of a substrate 110 and forming a front side lower interlayer insulating layer 130L on the front surface FS of the substrate 110 to cover the unit device(s) 120. Each of the unit device(s) 120 may include a MOS transistor or other suitable microelectronic devices. The front side lower interlayer insulating layer 130L may include silicon oxide.

Referring to FIG. 2B, the method may include forming a pad mask layer 135 on a substantially entire surface of the front side lower interlayer insulating layer 130L. The pad mask layer 135 may be formed of a single layer or a multilayered structure. The pad mask layer 135 may include silicon nitride.

Referring to FIG. 2C, the method may include forming a TSV hole mask pattern 205 on the pad mask layer 135. The TSV hole mask pattern 205 may include an organic material, such as silicon nitride, silicon oxynitride, or photoresist (PR).

Referring to FIG. 2D, the method may include forming TSV holes H in the substrate 110. Forming the TSV holes H may include etching the substrate 110 using the TSV hole mask pattern 205 as a patterning mask. Bottom surfaces of the TSV holes H may be disposed in the substrate 110. In other words, the TSV holes H may not completely penetrate the substrate 110, i.e., not extending to a back surface BS of the substrate 110. Each of the bottom surfaces of the TSV holes H may have a concave portion CP. Although FIG. 2D illustrates an example in which each of the bottom surfaces of the TSV holes H includes a single concave portion CP, each of the bottom surfaces of the TSV holes H may include a plurality of concave portions CP. After forming the TSV holes H, the TSV hole mask pattern 205 may be removed.

Referring to FIG. 2E, the method may include conformally forming a TSV liner layer 21, a TSV barrier layer 22, and a TSV seed layer 23 on the front side lower interlayer insulating layer 130L and inner walls of the TSV holes H. The TSV liner layer 21 may include an insulating material, such as silicon oxide. For example, the TSV liner layer 21 may be deposited using an atomic layered deposition (ALD) process, a plasma-enhanced chemical vapor deposition (PECVD) process, or a sub-atmosphere CVD (SACVD) process. Alternatively, the TSV liner layer 21 may be formed by thermally oxidizing the inner walls of the TSV holes H using a thermal oxidation process. Forming the TSV barrier layer 22 may include conformally forming a barrier metal layer on the TSV liner layer 21 using a physical vapor deposition (PVD) process, such as a sputtering process, or a metal organic CVD (MOCVD) process. The TSV barrier layer 22 may include titanium (Ti), titanium nitride (TiN), titanium tungsten (TiW), tantalum (Ta), tantalum nitride (TaN), tungsten (W), or tungsten nitride (WN). The TSV barrier layer 22 may be formed using a single layer or a multilayered structure. Forming the TSV seed layer 23 may include conformally forming a seed metal layer on the TSV barrier layer 22 using a PVD process or a CVD process. The TSV seed layer 23 may include copper (Cu), ruthenium (Ru), nickel (Ni), or tungsten (W).

Referring to FIG. 2F, the method may include forming a TSV core material layer 24 on the TSV seed layer 23 to fill the TSV holes H. The TSV core material layer 24 may be formed using an electroplating (EP) process. When the TSV seed layer 23 and the TSV core material layer 24 include the same material, a boundary between the TSV seed layer 23 and the TSV core material layer 24 may disappear. For example, when both the TSV seed layer 23 and the TSV core material layer 24 include copper, a boundary therebetween may disappear. Although the boundary between the TSV seed layer 23 and the TSV core material layer 24 is illustrated with a dotted line to distinguish the TSV seed layer 23 from the TSV core material layer 24, the illustration of the TSV seed layer 23 will be omitted below for the sake of brevity.

Referring to FIG. 2G, the method may include exposing a surface of the front side lower interlayer insulating layer 130L using a planarization process, such as a chemical mechanical polishing (CMP) process. For example, the method may include removing the TSV core material layer 24 and the TSV seed layer 23 from the front side lower interlayer insulating layer 130L using a first CMP process, removing the TSV barrier layer 22 from the front side lower interlayer insulating layer 130L using a second CMP process, and removing the TSV liner layer 21 and the pad mask layer 135 from the front side lower interlayer insulating layer 130L using a wet etching process. Due to the above-described process, the TSV liner layer 21, the TSV bather layer 22, the TSV seed layer 23, and the TSV core material layer 24, which may remain within the TSV holes H, may be respectively modified into a TSV liner pattern 210, a TSV bather pattern 220, a TSV seed pattern 230, and a TSV core pattern 240. As a result, TSV structures 200 including the TSV liner pattern 210, the TSV bather pattern 220, the TSV seed pattern 230, and the TSV core pattern 240 may be formed.

Referring to FIG. 2H, the method may include forming internal circuits 140 on the front side lower interlayer insulating layer 130L and the TSV structures 200. The internal circuits 140 may include a plurality of conductive inner vias 141 and multilayered conductive inner wires 142. FIG. 2H illustrates an example in which the inner vias 141 have substantially vertically extending pillar shapes and the inner wires 142 have horizontally extending mesa shapes. The internal circuits 140 may include a conductor, such as doped-Si, a metal, a metal silicide, a metal alloy, or a metal compound. Also, the process may further include forming a TSV pad 143 on the front side lower interlayer insulating layer 130L in contact (e.g., direct contact) with a front end FE of the TSV structures 200. For example, the TSV pad 143 may cover the front end FE of the TSV structures 200 on the front side lower interlayer insulating layer 130L. The TSV pad 143 may be formed of a single layer or multilayered structure formed of a conductive material (e.g., a barrier metal layer and a pad metal layer). Also, the process may include forming a front side upper interlayer insulating layer 130U on the front side lower interlayer insulating layer 130L to cover the internal circuits 140. The front side upper interlayer insulating layer 130U may be formed of a single layer or a multilayered structure. For brevity, FIG. 2H illustrates an example in which the front side upper interlayer insulating layer 130U is formed as a single layer.

Referring to FIG. 2I, the method may include forming a front side bump via plug 144 and a front side pad 145 in the front side lower interlayer insulating layer 130L and the front side upper interlayer insulating layer 130U to be electrically connected to the front end FE of at least one of the TSV structures 200, and forming a front side passivation layer 150 on the front side upper interlayer insulating layer 130U. The front side bump via plug 144 may be substantially vertically formed in the front side upper interlayer insulating layer 130U to be electrically connected to some of the conductive inner wires 142. The front side bump via plug 144 may include a metal, such as copper (Cu), aluminum (Al), or tungsten (W). The front side pad 145 may be formed to cover a top surface of the front side bump via plug 144. The front side pad 145 may be in contact (e.g., direct contact) with a front side bump 300 to be described later. The front side passivation layer 150 may include a lower opening 150a that exposes an upper portion of the front side pad 145. The front side passivation layer 150 may include silicon nitride, silicon oxide, or PI.

Referring to FIG. 2J, the method may include forming a front side bump barrier layer 310 on the front side passivation layer 150 and within the lower opening 150a of the front side passivation layer 150. Forming the front side bump barrier layer 310 may include conformally forming a barrier metal layer on the front side passivation layer 150 using a PVD process, such as a sputtering process, or an MOCVD process. The front side bump barrier layer 310 may include titanium (Ti), titanium nitride (TiN), titanium tungsten (TiW), tantalum (Ta), tantalum nitride (TaN), or tungsten nitride (WN). The front side bump barrier layer 310 may be formed as a single layer or a multilayered structure.

Referring to FIG. 2K, the method may include forming a front side bump mask pattern 305 on the front side bump barrier layer 310. The front side bump mask pattern 305 may have an upper opening 305a substantially vertically aligned with the lower opening 150a of the front side passivation layer 150. The front side bump mask pattern 305 may include a photoresist pattern.

Referring to FIG. 2L, the method may include forming a front side bump conductive layer 320 and a front side bump capping layer 330 within the lower opening 150a of the front side passivation layer 150 and the upper opening 305a of the front side bump mask pattern 305. Forming the front side bump conductive layer 320 may include forming a metal layer formed of a conductive material such as nickel (Ni) or tungsten (W), using an EP process. Forming the front side bump capping layer 330 may include plating gold (Au), nickel (Ni), or silver (Ag) on the front side bump conductive layer 320.

Referring to FIG. 2M, the method may include removing the front side bump mask pattern 305 to expose a portion of the front side bump barrier layer 310 and partially removing the exposed portion of the front side bump barrier layer 310 on the front side passivation layer 150 using a wet etching process. Due to the above-described process, a front side bump 300 including the front side bump barrier layer 310, the front side bump conductive layer 320, and the front side bump capping layer 330 may be formed.

Referring to FIG. 2N, the method may include turning the substrate 110 upside down to mount the substrate 110 on a wafer support carrier WSC. A cushion layer C configured to protect the front side bump 300 from a physical shock may be disposed on the WSC.

Referring to FIG. 2O, the method may include entirely removing a bottom portion of the substrate 110 to expose a back end BE of the TSV structure 200. For example, a top surface and partial side surfaces of the TSV core pattern 240 of the TSV structure 200 may be exposed. Removing the bottom portion of the substrate 110 may include, for example, a grinding process and/or an etch-back process.

Referring to FIG. 2P, the method may include forming a back side interlayer insulating layer 160 on the back surface BS of the substrate 110 to cover the back end BE of the TSV structure 200. The back side interlayer insulating layer 160 may be formed of a single layer or a multilayered structure. The back side interlayer insulating layer 160 may include silicon oxide.

Referring to FIGS. 2Q through 2S, the method may include partially removing the back end BE of the TSV core pattern 240 of the TSV structure 200 using a planarization process, such as a CMP process. The CMP process may include several steps (e.g., step 1 through step 4). In FIG. 2Q, positions in which TSV structures 200 underwent the respective steps of the CMP process are illustrated with various imaginary dotted lines.

FIG. 2R shows cross-sectional views of the TSV core pattern 240 corresponding to the respective steps of the CMP process of FIG. 2Q and plan views of surfaces of the back end BE of the TSV core pattern 240 on which the respective steps of the CMP process are performed. Referring to FIG. 2R, as the steps of the CMP process are performed, the back end BE of the TSV core pattern 240 may be partially removed to expose a surface of the back end BE. Also, the exposed surface of the back end BE of the TSV core pattern 240 may be changed from a ring shape into a simple closed curve shape, such as a circular shape, an elliptical shape, or a polygonal shape. In this case, parameters, such as widths (e.g., A1, A2, B1, B2, C1, and C2) of the ring shape and/or a parameter (e.g., a diameter D of the circular shape) of the shape of the exposed surface of the back end BE of the TSV core pattern 240, may be defined as a "critical dimension (CD)." The respective steps of the CMP process may be monitored with reference to the size of CD so that the CMP process can be controlled.

For example, in step 1, the CD may be A1 and A2, which are the widths of the ring shape. When it is determined that the ring widths A1 and A2 are equal, it can be inferred that the corresponding CMP process has been adequately horizontally performed. However, when it is determined that the ring widths A1 and A2 are different, it may be inferred that the corresponding CMP process has been performed at an angle tilted from horizontal. That is, it can be inferred that an angle of a CMP process corresponding to a ring width that is disproportionately large on one side of the ring is inclined from horizontal. In this case, the angle of the CMP process can be adjusted accordingly. For instance, the angle at which the CMP process is performed can be increased or decreased in a place corresponding to the disproportionate ring width, as desired, so that a subsequent CMP process can be adequately horizontally performed.

In addition, a subsequent CMP process time may be analyzed from the size of CD monitored in step 1 and the size of CD monitored in step 2. For example, when a CMP process was performed for a first time period t1 in step 1 and the surface of the back end BE of the TSV core pattern 240 had a ring shape with a ring width A1 (it is assumed that the ring widths A1 and A2 are equal), and when a CMP process was performed for a second time period t2 in step 2 and the surface of the back end BE of the TSV core pattern 240 had a ring shape with a ring width B1 (it is assumed that ring widths B1 and B2 are equal), a subsequent CMP process time for obtaining the TSV core pattern 240 having a desired shape (e.g., the circular shape of step 4) and size may be calculated with reference to the size of CDs obtained during the two CMP processes.

Although not shown, when the back ends BE of the TSV structures 200 have a plurality of concave portions CP, a surface of the back end BE of each of the TSV core patterns 240 may have not a single ring shape, but may instead have a multi-ring shape in step 1 through step 3. Like a case in which the surface of the back end BE of each of the TSV core patterns 240 has a single ring shape, when the surface of the back end BE of each of the TSV core patterns 240 has a multi-ring shape, ring widths of respective ring shapes may be monitored, and an angle of a CMP process in a place corresponding to an uneven ring width may be adjusted so that a subsequent CMP process can be horizontally performed in a proper manner.

In addition, a plurality of TSV structures 200 may be disposed in the substrate 110. In this case, CDs of the TSV structures measured in the respective positions may be compared so that the CMP process can be controlled. Specifically, the TSV structures may be located in the center of the substrate 110 or near an edge of the substrate 110 (for example, near an upper, lower, left, and right edge). Based on the location of the TSV structures and the measured CD corresponding to that TSV structures, the CDs of the TSV structures may be compared to control the CMP process. That is, when the CDs of the TSV structures disposed in the respective positions are different, it may be inferred that the corresponding CMP process has been performed at an angle tilted from horizontal. In other words, it may be inferred that an angle of a CMP process corresponding to a position of a TSV structure having a disproportionately large CD is angled downward toward that TSV structure. Accordingly, the angle of the CMP process corresponding to the position of the TSV structure having the large CD may be corrected so that a subsequent CMP process can be adequately horizontally performed. Similarly, an angle of a CMP process corresponding to a position of a TSV structure having a relatively small CD may be adjusted so that a subsequent CMP process can be horizontally performed.

Thus, each step of the CMP process may be monitored and controlled during a process of back-grinding a semiconductor device according to some embodiments of the inventive concept so that the CMP process can be controlled more stably and reliably.

FIG. 2S illustrates a case in which a CMP process is performed until the exposed surface of the back end BE of the TSV core pattern 240 may have a simple closed curve shape formed from a closed curved line (e.g., circular shape) (for example, step 4). In this case, the semiconductor device 10A shown in FIG. 1A may be formed using subsequent processes to be described later. Also, a CMP process may be performed until the exposed surface of the back end BE of the TSV core pattern 240 has a ring shape with a desired width to leave a portion of the concave portion CP of the back ends BE of the TSV structures 200 (for example, step 3). In this case, the semiconductor device 10C shown in FIG. 1C may be formed using subsequent processes to be described later.

Referring to FIG. 2T, the method may include forming a redistribution mask pattern 405 having a groove 405a on the back side interlayer insulating layer 160 to expose the back end BE of the TSV structure 200. The groove 405a of the redistribution mask pattern 405 may particularly expose the back end BE of the TSV core pattern 240, which is partially removed using the CMP process. The redistribution mask pattern 405 may include an organic material, such as photoresist.

Referring to FIG. 2U, the method may include filling the groove 405a with a redistribution layer 400. The redistribution layer 400 may include nickel (Ni) or gold (Au) formed on a surface thereof.

Referring to FIG. 2V, the method may include removing the redistribution mask pattern 405.

Referring to FIG. 2W, the method may include forming a back side passivation layer 170 on the back side interlayer insulating layer 160 to expose a portion of the redistribution layer 400. The back side passivation layer 170 may include a lower opening 170a exposing a portion of the redistribution layer 400. The back side passivation layer 170 may include silicon nitride.

Referring to FIG. 2X, the method may include forming a back side bump barrier layer 510 on the back side passivation layer 170 and within the lower opening 170a of the back side passivation layer 170. Forming the back side bump bather layer 510 may include conformally forming a barrier metal layer on the back side passivation layer 170 and within the lower opening 170a using a PVD process, such as a sputtering process, or an MOCVD process. The back side bump barrier layer 510 may include titanium (Ti), titanium nitride (TiN), titanium tungsten (TiW), tantalum (Ta), tantalum nitride (TaN), or tungsten nitride (WN). The back side bump bather layer 510 may be formed using a single layer or a multilayered structure.

Referring to FIG. 2Y, the method may include forming a back side bump mask pattern 505 on the back side bump bather layer 510. The back side bump mask pattern 505 may have an upper opening 505a substantially vertically aligned with the lower opening 170a of the back side passivation layer 170. The back side bump mask pattern 505 may include photoresist.

Referring to FIG. 2Z, the method may include forming a back side bump conductive layer 520 and a back side bump capping layer 530 within the lower opening 170a of the back side passivation layer 170 and the upper opening 505a of the back side bump mask pattern 505. Forming the back side bump conductive layer 520 may include forming a metal, such as nickel (Ni) or tungsten (W), using an EP process. Forming the back side bump capping layer 530 may include plating gold (Au), nickel (Ni), or silver (Ag) on the back side bump conductive layer 520.

Referring back to FIG. 1A, the method may include removing the back side bump mask pattern 505 to expose the back side bump barrier layer 510, and partially removing the back side bump barrier layer 510 exposed on the back side passivation layer 170 using a wet etching process. Due to the above-described process, a back side bump 500 including the back side bump barrier layer 510, the back side bump conductive layer 520, and the back side bump capping layer 530 may be formed.

The method of fabricating the semiconductor device according to some embodiments of the inventive concept may include forming concave portions CP in the back ends BE of the TSV structures 200. Thus, since a back grinding process may be monitored, process controllability may be improved, and process stability and reliability may be ensured.

Figure 3A:
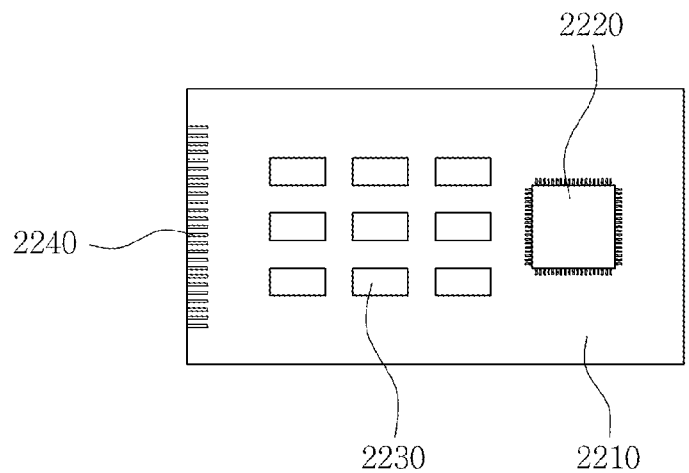
FIG. 3A is a conceptual diagram of a semiconductor module including semiconductor devices according to various embodiments of the inventive concept.

FIG. 3A is a conceptual diagram of a semiconductor module 2200 including semiconductor devices 10A, 10B, and 10C according to various embodiments of the inventive concept. Referring to FIG. 3A, the semiconductor module 2200 according to the embodiments of the inventive concept may include the semiconductor devices 10A, 10B, and 10C according to various embodiments of the inventive concept, which may be mounted on a semiconductor module substrate 2210. The semiconductor module 2200 may further include a microprocessor (MP) 2220 mounted on the semiconductor module substrate 2210. Input/output (I/O) terminals 2240 may be disposed on at least one side of the semiconductor module substrate 2210.

Figure 3B:
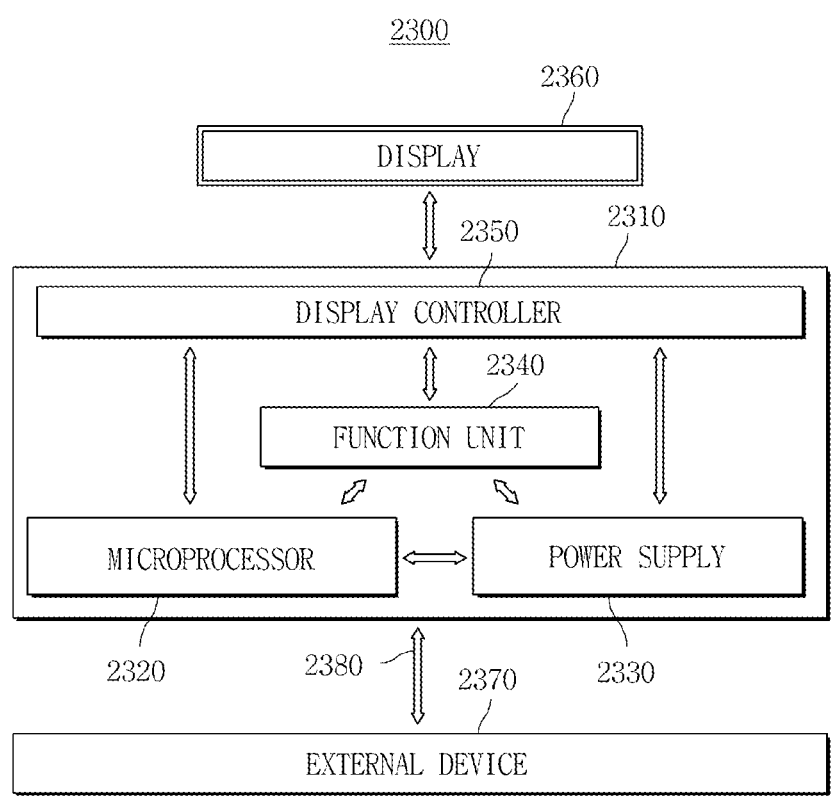
FIG. 3B is a conceptual block diagram of an electronic system including semiconductor devices according to various embodiments of the inventive concept.

FIG. 3B is a conceptual block diagram of an electronic system 2300 including the semiconductor devices 10A, 10B, and 10C according to various embodiments of the inventive concept. Referring to FIG. 3B, the semiconductor devices 10A, 10B, and 10C according to various embodiments of the inventive concept may be applied to the electronic system 2300. The electronic system 2300 may include a body 2310. The body 2310 may include an MP 2320, a power supply 2330, a function unit 2340, and/or a display controller 2350. The body 2310 may be a system board or motherboard having a printed circuit board (PCB). The MP 2320, the power supply 2330, the function unit 2340, and the display controller 2350 may be mounted or installed on the body 2310. A display 2360 may be disposed on a top surface of the body 2310 or outside the body 2310. For example, the display 2360 may be disposed on a surface of the body 2310 and display an image processed by the display controller 2350. The power supply 2330 may receive a predetermined voltage from an external power source, divide the predetermined voltage into various voltage levels, and transmit divided voltages to the MP 2320, the function unit 2340, and the display controller 2350. The MP 2320 may receive a voltage from the power supply 2330 and control the function unit 2340 and the display 2360. The function unit 2340 may implement various functions of the electronic system 2300. For instance, when the electronic system 2300 is a mobile electronic product, such as a portable phone, the function unit 2340 may include several elements capable of wireless communication functions, such as output of an image to the display 2360 or output of a voice to a speaker, by dialing or communication with an external apparatus 2370. When the electronic system 2300 includes a camera, the function unit 2340 may serve as an image processor. In other embodiments, when the electronic system 2300 is connected to a memory card to increase its capacity, the function unit 2340 may be a memory card controller. The function unit 2340 may exchange signals with the external apparatus 2370 through a wired or wireless communication unit 2380. In addition, when the electronic system 2300 needs a universal serial bus (USB) to expand functions thereof, the function unit 2340 may serve as an interface controller. The semiconductor devices 10A, 10B, and 10C according to various embodiments of the inventive concept may be included in at least one of the MP 2320 and the function unit 2340.

Figure 3C:
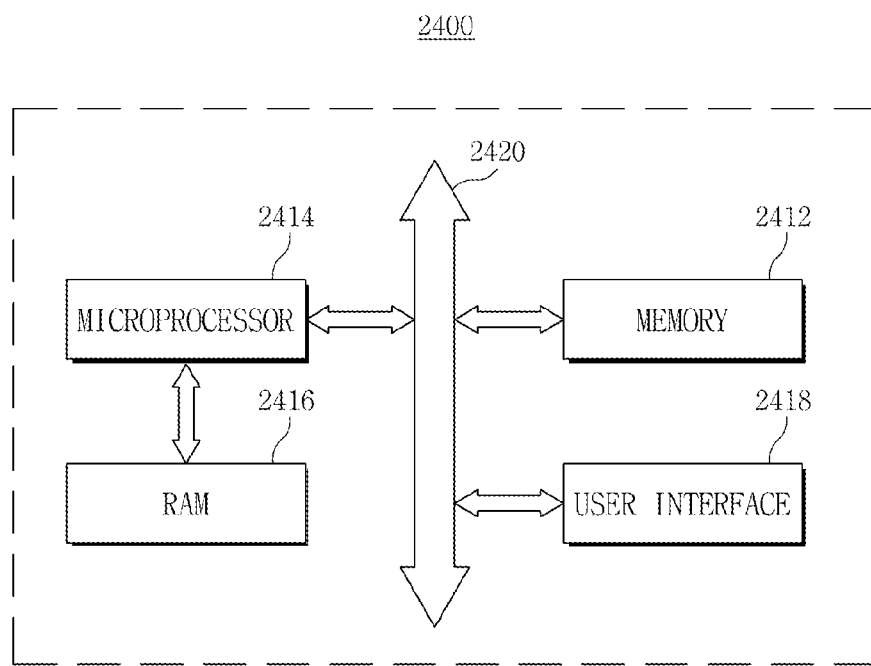
FIG. 3C is a schematic block diagram of another electronic system including semiconductor devices according to various embodiments of the inventive concept.

FIG. 3C is a schematic block diagram of another electronic system 2400 including semiconductor devices 10A, 10B, and 10C according to various embodiments of the inventive concept. Referring to FIG. 3C, the electronic system 2400 may include semiconductor devices 10A, 10B, and 10C according to various embodiments of the inventive concept. The electronic system 2400 may be used to fabricate a mobile device or computer. For example, the electronic system 2400 may include a memory system 2412, an MP 2414, a random access memory (RAM) 2416, and a user interface 2418, which may communicate data using a bus 2420. The MP 2414 may program and control the electronic system 2400. The RAM 2416 may be used as an operation memory of the MP 2414. For example, the MP 2414 or the RAM 2416 may include the semiconductor devices 10A and 10B according to various embodiments of the inventive concept. The MP 2414, the RAM 2416, and/or other elements may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include a controller and a memory.

Figure 3D:
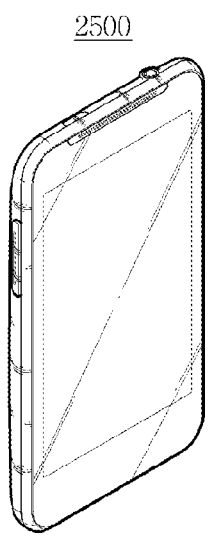
FIG. 3D is a schematic diagram of a mobile device including semiconductor devices according to various embodiments of the inventive concept.

FIG. 3D is a schematic diagram of a mobile device 2500 including at least one of the semiconductor devices 10A, 10B, and 10C according to various embodiments of the inventive concept. The mobile device 2500 may be interpreted as a mobile phone or tablet personal computer (PC). Furthermore, at least one of the semiconductor devices 10A, 10B, and 10C according to various embodiments of the inventive concept may be used not only for a mobile phone or a tablet PC but also for a portable computer such as a laptop computer, an MPEG-1 audio layer 3 (MP3) player, an MP4 player, a navigation device, a solid-state disk (SSD), a desktop computer, or electronic appliances for automotive and household uses.

A semiconductor device according to embodiments of the inventive concept can include a TSV structure having concave portions CP formed in a back end thereof. As a result, since a back grinding process can be monitored, process controllability can be improved, and process stability and reliability can be ensured.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, the method comprising:
   forming at least one unit device on a front side of a substrate;
   forming a through-silicon via (TSV) structure to substantially vertically penetrate the substrate, the TSV structure having a back end including a concave portion;
   forming an internal circuit overlying a front end of the TSV structure to be electrically connected to the at least one unit device and the front end of the TSV structure; and
   forming a front side bump on the front side of the substrate to be electrically connected to the front end of the TSV structure;
   wherein the forming of the TSV structure comprises:
   forming a front side lower interlayer insulating layer on the front side of the substrate to cover the at least one unit device;
   performing an etching process using a TSV hole mask pattern formed on the front side lower interlayer insulating layer as a patterning mask to form a TSV hole in the substrate, the TSV hole having a bottom surface;
   removing the TSV hole mask pattern;
   sequentially forming a TSV liner layer, a TSV barrier layer, and a TSV seed layer on the front side lower interlayer insulating layer and on an inner wall of the TSV hole;
   forming a TSV core material layer on the TSV seed layer to fill the TSV hole; and performing a planarization process on the resulting structure to expose a surface of the front side lower interlayer insulating layer to form a TSV liner pattern, a TSV barrier pattern, a TSV seed pattern, and a TSV core pattern within the TSV hole.

2. The method of claim 1, which further comprises forming a redistribution layer on a back side of the substrate to be electrically connected to the back end of the TSV structure; and forming a back side bump to be electrically connected to the redistribution layer.

3. The method of claim 1, wherein exposing of the front side lower interlayer insulating layer comprises:
performing a first chemical mechanical polishing (CMP) process to remove the TSV core material layer and the TSV seed layer from the front side lower interlayer insulating layer;
performing a second CMP process to remove the TSV barrier layer from the front side lower interlayer insulating layer; and
performing a wet etching process to remove the TSV liner layer from the front side lower interlayer insulating layer.

4. The method of claim 1, wherein the forming of the internal circuit comprises:
forming a plurality of conductive inner vias and multilayered conductive inner wires on the front side lower interlayer insulating layer and the TSV structures;
forming a TSV pad on the front side lower interlayer insulating layer in contact with the front end of the TSV structure;
forming a front side upper interlayer insulating layer on the front side lower interlayer insulating layer to cover the plurality of conductive inner vias, the multilayered conductive inner wires, and the TSV pad;
forming a front side bump via plug in the front lower and upper interlayer insulating layers to be electrically connected to the front end of the TSV structure; and
forming a front side pad to cover a top surface of the front side bump via plug.

5. The method of claim 4, wherein the forming of the front side bump comprises:
forming a front side passivation layer on the front side upper interlayer insulating layer, the front side passivation layer including a lower opening that exposes an upper portion of the front side pad;
forming a front side bump barrier layer on the front side passivation layer and within the lower opening;
forming a front side bump mask pattern on the front side bump barrier layer, the front side bump mask pattern having an upper opening substantially vertically aligned with the lower opening;
forming a front side bump metal layer and a front side bump capping layer within the lower opening and the upper opening;
removing the front side bump mask pattern to expose a portion of the front side bump barrier layer; and
partially removing the exposed portion of the front side bump barrier layer on the front side passivation layer.

6. The method of claim 1, wherein the forming of the redistribution layer comprises:
substantially entirely removing the back side of the substrate to expose back ends of the TSV structures;
forming a back side interlayer insulating layer on the back side of the substrate to cover the back ends of the TSV structures;
partially removing a back end of the TSV core pattern of each of the TSV structures;
forming a redistribution mask pattern on the back side interlayer insulating layer, the redistribution mask pattern having a groove that exposes the partially removed back end of the TSV core pattern;
filling the groove with the redistribution layer; and
removing the redistribution mask pattern.

7. The method of claim 6, wherein the forming of the back side bump comprises:
forming a back side passivation layer on the back side interlayer insulating layer, the back side passivation layer having a lower opening that exposes a portion of the redistribution layer;
forming a back side bump barrier layer on the back side passivation layer and within the lower opening;
forming a back side bump mask pattern on the back side bump barrier layer, the back side bump mask pattern having an upper opening substantially vertically aligned with the lower opening;
forming a back side bump metal layer and a back side bump capping layer within the lower and upper openings;
removing the back side bump mask pattern to expose a portion of the back side bump barrier layer; and
partially removing the exposed portion of the back side bump barrier layer on the back side passivation layer.

8. The method of claim 6, wherein the partial removing of the back end of the TSV core pattern comprises performing a plurality of CMP processes such that surfaces of back ends of TSV core patterns have ring shapes, and the ring shapes have a substantially constant width.

9. The method of claim 7, wherein the performing of the plurality of CMP processes comprises:
monitoring widths of the ring shapes; and
performing a subsequent CMP process by controlling an angle of a CMP process when the ring widths are not constant.

10. The method of claim 9, wherein the controlling of the angle of the CMP process comprises correcting an angle of a CMP process in a place corresponding to a relatively larger one or a relatively smaller one of the monitored ring widths.

11. The method of claim 6, wherein the partial removing of the back end of the TSV core pattern comprises performing a plurality of CMP processes such that a surface of the back end of the TSV core pattern has a simple closed curve shape.

12. A method of fabricating a semiconductor device, the method comprising:
forming a front side lower interlayer insulating layer to cover at least one unit device formed in a substrate and on a front side of the substrate;
forming a TSV hole in the substrate using an etching process such that a plurality of concave portions are formed in a bottom surface of the substrate, the TSV hole spaced apart from the at least one unit device to substantially vertically penetrate the substrate;
sequentially forming a TSV liner layer, a TSV barrier layer, and a TSV seed layer on the front side lower interlayer insulating layer and an inner wall of the TSV hole;
forming a TSV core material layer on the TSV seed layer to fill the TSV hole;
exposing a surface of the front side lower interlayer insulating layer using a planarization process;
forming a TSV structure including a TSV liner pattern, a TSV barrier pattern, a TSV seed pattern, and a TSV core pattern within the TSV hole formed using the planarization process;

forming an internal circuit on the front side of the substrate and a front end of the TSV structure to be electrically connected to the at least one unit device and the front end of the TSV structure;

forming a front side bump on the front side of the substrate to be electrically connected to the front end of the TSV structure;

forming a redistribution layer on a back side of the substrate to be electrically connected to back ends of the TSV structures; and forming a back side bump to be electrically connected to the redistribution layer.

13. The method of claim 12, wherein the forming of the redistribution layer comprises:

removing the back side of the substrate to expose the back ends of the TSV structures;

forming a back side interlayer insulating layer on the back side of the substrate to cover the back ends of the TSV structures;

partially removing a back end of a TSV core pattern of the TSV structure using a planarization process;

forming a redistribution mask pattern on the back side interlayer insulating layer, the redistribution mask pattern having a groove exposing the partially removed back end of the TSV core pattern;

filling the groove with the redistribution layer; and removing the redistribution mask pattern.

14. The method of claim 13, wherein the partial removing of the back end of the TSV core pattern comprises performing a plurality of CMP processes such that a surface of the back end of the TSV core pattern has a multi-ring shape, and respective ring shapes have constant ring widths.

15. The method of claim 14, wherein the performing the plurality of CMP processes comprises:

monitoring the widths of the respective ring shapes; and performing a subsequent CMP process by controlling an angle of a CMP process when the ring widths are not constant.

16. A semiconductor device comprising:

at least one unit device on a front side of the substrate;

a through-silicon via (TSV) structure apart substantially vertically penetrating the substrate, the TSV structure having a back end including a concave portion;

an internal circuit on the front side of the substrate and a front end of the TSV structure to be electrically connected to the at least one unit device and the front end of the TSV structure;

a front side bump on a front side of a substrate to be electrically connected to the front end of the TSV structure;

a back side bump to be electrically connected to the TSV structure; and a redistribution layer on a back side of the substrate to be electrically connected to the back end of the TSV structure and to the back side bump.

\* \* \* \* \*